(12) United States Patent
Shen et al.

(10) Patent No.: US 9,536,862 B2
(45) Date of Patent: Jan. 3, 2017

(54) MICROELECTRONIC ASSEMBLIES WITH INTEGRATED CIRCUITS AND INTERPOSERS WITH CAVITIES, AND METHODS OF MANUFACTURE

(71) Applicant: Invensas Corporation, San Jose, CA (US)

(72) Inventors: Hong Shen, Palo Alto, CA (US); Charles G. Woychik, San Jose, CA (US); Arkalgud R. Sitaram, Cupertino, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 14/980,996

(22) Filed: Dec. 28, 2015

(65) Prior Publication Data
US 2016/0133600 A1 May 12, 2016

Related U.S. Application Data

(62) Division of application No. 14/328,380, filed on Jul. 10, 2014, now Pat. No. 9,252,127.

(51) Int. Cl.
*H01L 23/48* (2006.01)
*H01L 21/50* (2006.01)
(Continued)

(52) U.S. Cl.
CPC ........... *H01L 25/0652* (2013.01); *H01L 21/52* (2013.01); *H01L 23/49811* (2013.01);
(Continued)

(58) Field of Classification Search
USPC ....................................... 257/678
See application file for complete search history.

(56) References Cited

U.S. PATENT DOCUMENTS 5,532,519 A 7/1996 Bertin et al.
5,701,233 A 12/1997 Carson et al.
(Continued)

FOREIGN PATENT DOCUMENTS

EP 1688994 B1 8/2008
EP 2546876 A1 1/2013
(Continued)

OTHER PUBLICATIONS

U.S. Appl. No. 14/328,380 titled, "Microelectronic Assemblies With Integrated Circuits and Interposers With Cavities, and Methods of Manufacture," filed Jul. 10, 2014.
(Continued)

*Primary Examiner* — Ha Tran T Nguyen
*Assistant Examiner* — Thai T Vuong
(74) *Attorney, Agent, or Firm* — Haynes and Boone, LLP

(57) ABSTRACT

Semiconductor integrated circuits (110) or assemblies are disposed at least partially in cavities between two interposers (120). Conductive vias (204M) pass through at least one of the interposers or at least through the interposer's substrate, and reach a semiconductor integrated circuit or an assembly. Other conductive vias (204M.1) pass at least partially through multiple interposers and are connected to conductive vias that reach, or are capacitively coupled to, a semiconductor IC or an assembly. Other features are also provided.

13 Claims, 22 Drawing Sheets

(51) Int. Cl.
*H01L 23/498* (2006.01)
*H01L 23/538* (2006.01)
*H01L 21/56* (2006.01)
*H01L 25/065* (2006.01)
*H01L 23/00* (2006.01)
*H01L 21/52* (2006.01)
*H01L 25/00* (2006.01)

(52) U.S. Cl.
CPC .. *H01L 23/49827* (2013.01); *H01L 23/49844* (2013.01); *H01L 23/5384* (2013.01); *H01L 24/09* (2013.01); *H01L 24/33* (2013.01); *H01L 24/73* (2013.01); *H01L 24/83* (2013.01); *H01L 24/92* (2013.01); *H01L 24/94* (2013.01); *H01L 24/97* (2013.01); *H01L 25/50* (2013.01); *H01L 2224/08165* (2013.01); *H01L 2224/08235* (2013.01); *H01L 2224/12105* (2013.01); *H01L 2224/16145* (2013.01); *H01L 2224/16227* (2013.01); *H01L 2224/17181* (2013.01); *H01L 2224/32145* (2013.01); *H01L 2224/48091* (2013.01); *H01L 2224/48145* (2013.01); *H01L 2224/48227* (2013.01); *H01L 2224/73204* (2013.01); *H01L 2224/73209* (2013.01); *H01L 2224/73253* (2013.01); *H01L 2224/73259* (2013.01); *H01L 2224/8182* (2013.01); *H01L 2224/85205* (2013.01); *H01L 2224/9202* (2013.01); *H01L 2224/92125* (2013.01); *H01L 2224/92224* (2013.01); *H01L 2224/94* (2013.01); *H01L 2224/97* (2013.01); *H01L 2225/06513* (2013.01); *H01L 2225/06517* (2013.01); *H01L 2225/06524* (2013.01); *H01L 2225/06527* (2013.01); *H01L 2225/06541* (2013.01); *H01L 2225/06544* (2013.01); *H01L 2225/06548* (2013.01); *H01L 2225/06572* (2013.01); *H01L 2225/06589* (2013.01); *H01L 2924/15153* (2013.01); *H01L 2924/15311* (2013.01); *H01L 2924/16235* (2013.01); *H01L 2924/16251* (2013.01)

(56) References Cited

U.S. PATENT DOCUMENTS

| | | | |
|---|---|---|---|
| 6,008,536 A | 12/1999 | Mertol | |
| 6,157,076 A | 12/2000 | Azotea et al. | |
| 6,222,722 B1 | 4/2001 | Fukuzumi et al. | |
| 6,251,796 B1 | 6/2001 | Abdul-Ridha et al. | |
| 6,322,903 B1 | 11/2001 | Siniaguine et al. | |
| 6,384,473 B1 | 5/2002 | Peterson et al. | |
| 6,403,444 B2 | 6/2002 | Fukuzumi et al. | |
| 6,451,650 B1 | 9/2002 | Lou | |
| 6,492,726 B1 | 12/2002 | Quek et al. | |
| 6,613,672 B1 | 9/2003 | Wang et al. | |
| 6,620,701 B2 | 9/2003 | Ning | |
| 6,624,505 B2 | 9/2003 | Badehi | |
| 6,717,254 B2 | 4/2004 | Siniaguine | |
| 6,746,876 B2 | 6/2004 | Itoh et al. | |
| 6,787,916 B2 | 9/2004 | Halahan | |
| 6,947,275 B1 | 9/2005 | Anderson et al. | |
| 6,958,285 B2 | 10/2005 | Siniaguine | |
| 7,011,988 B2 | 3/2006 | Forcier | |
| 7,049,170 B2 | 5/2006 | Savastiouk et al. | |
| 7,061,102 B2 | 6/2006 | Eghan et al. | |
| 7,115,988 B1 | 10/2006 | Hool | |
| 7,144,745 B2 | 12/2006 | Badehi | |
| 7,183,643 B2 | 2/2007 | Gibson et al. | |
| 7,186,586 B2 | 3/2007 | Savastiouk et al. | |
| 7,400,036 B2 | 7/2008 | Tan | |
| 7,670,921 B2 | 3/2010 | Chinthakindi et al. | |
| 7,786,591 B2 | 8/2010 | Khan et al. | |
| 7,863,096 B2 | 1/2011 | England | |
| 7,906,803 B2 | 3/2011 | Shioya et al. | |
| 7,928,548 B2 | 4/2011 | Bernstein et al. | |
| 7,964,508 B2 | 6/2011 | Savastiouk et al. | |
| 7,977,579 B2 | 7/2011 | Bathan et al. | |
| 7,989,270 B2 | 8/2011 | Huang et al. | |
| 8,018,068 B1 | 9/2011 | Scanlan | |
| 8,071,470 B2 | 12/2011 | Khor et al. | |
| 8,072,082 B2 | 12/2011 | Yean et al. | |
| 8,076,788 B2 | 12/2011 | Haba et al. | |
| 8,102,039 B2 | 1/2012 | Noma et al. | |
| 8,110,862 B2 | 2/2012 | Cheng et al. | |
| 8,183,696 B2 | 5/2012 | Meyer et al. | |
| 8,257,985 B2 | 9/2012 | Stevenson et al. | |
| 8,377,829 B2 | 2/2013 | Yeh et al. | |
| 8,378,480 B2 | 2/2013 | Chen et al. | |
| 8,397,013 B1 | 3/2013 | Rosenband et al. | |
| 8,426,961 B2 | 4/2013 | Shih et al. | |
| 8,470,668 B2 | 6/2013 | Cho et al. | |
| 8,518,753 B2 | 8/2013 | Wu et al. | |
| 8,519,537 B2 | 8/2013 | Jeng et al. | |
| 8,525,318 B1 | 9/2013 | Kim | |
| 8,575,493 B1 | 11/2013 | Xu et al. | |
| 8,598,695 B2 | 12/2013 | Oganesian et al. | |
| 8,629,546 B1 | 1/2014 | Scanlan | |
| 8,674,423 B2 | 3/2014 | Collins et al. | |
| 8,830,689 B2 | 9/2014 | Kim et al. | |
| 9,165,793 B1 | 10/2015 | Wang et al. | |
| 9,252,127 B1 | 2/2016 | Shen et al. | |
| 2003/0047798 A1* | 3/2003 | Halahan | H01L 23/13 257/685 |
| 2004/0134796 A1 | 7/2004 | Shelp et al. | |
| 2004/0174682 A1 | 9/2004 | Lin et al. | |
| 2004/0178495 A1 | 9/2004 | Yean | |
| 2004/0183187 A1 | 9/2004 | Yamasaki et al. | |
| 2004/0201111 A1 | 10/2004 | Thurgood | |
| 2004/0238934 A1 | 12/2004 | Warner et al. | |
| 2005/0046002 A1 | 3/2005 | Lee | |
| 2005/0047094 A1 | 3/2005 | Hsu et al. | |
| 2005/0068739 A1 | 3/2005 | Arvelo et al. | |
| 2005/0196095 A1 | 9/2005 | Karashima et al. | |
| 2005/0263869 A1 | 12/2005 | Tanaka et al. | |
| 2005/0266701 A1 | 12/2005 | Aoyagi | |
| 2006/0231937 A1* | 10/2006 | Juskey | H01L 21/561 257/686 |
| 2007/0029654 A1 | 2/2007 | Sunohara et al. | |
| 2007/0045798 A1 | 3/2007 | Horie et al. | |
| 2007/0197013 A1 | 8/2007 | Trezza | |
| 2007/0221399 A1 | 9/2007 | Nishizawa et al. | |
| 2007/0235850 A1 | 10/2007 | Gerber et al. | |
| 2008/0128897 A1 | 6/2008 | Chao | |
| 2008/0211089 A1* | 9/2008 | Khan | H01L 23/16 257/723 |
| 2008/0244902 A1 | 10/2008 | Blackwell et al. | |
| 2008/0272477 A1* | 11/2008 | Do | H01L 21/76898 257/686 |
| 2008/0280394 A1 | 11/2008 | Murtuza | |
| 2009/0008762 A1 | 1/2009 | Jung | |
| 2009/0115047 A1 | 5/2009 | Haba et al. | |
| 2009/0212407 A1 | 8/2009 | Foster et al. | |
| 2009/0236718 A1* | 9/2009 | Yang | H01L 25/03 257/686 |
| 2009/0267238 A1 | 10/2009 | Joseph et al. | |
| 2010/0025081 A1 | 2/2010 | Arai et al. | |
| 2010/0081236 A1 | 4/2010 | Yang et al. | |
| 2010/0084761 A1 | 4/2010 | Shinagawa | |
| 2010/0102428 A1* | 4/2010 | Lee | H01L 23/481 257/686 |
| 2010/0134991 A1 | 6/2010 | Kim | |
| 2010/0140769 A1* | 6/2010 | Kim | H01L 23/13 257/686 |
| 2010/0144101 A1 | 6/2010 | Chow | |
| 2010/0224980 A1 | 9/2010 | Chahal et al. | |
| 2010/0230797 A1 | 9/2010 | Honda | |
| 2010/0230806 A1 | 9/2010 | Huang et al. | |
| 2010/0276799 A1 | 11/2010 | Heng et al. | |
| 2011/0027967 A1 | 2/2011 | Beyne et al. | |
| 2011/0068444 A1 | 3/2011 | Chi et al. | |
| 2011/0068468 A1 | 3/2011 | Lin | |
| 2011/0080713 A1 | 4/2011 | Sunohara | |

(56) References Cited

U.S. PATENT DOCUMENTS

| | | |
|---|---|---|
| 2011/0095403 A1 | 4/2011 | Lee et al. |
| 2011/0101349 A1 | 5/2011 | Oda |
| 2011/0140283 A1* | 6/2011 | Chandra ............ H01L 23/5385 257/777 |
| 2011/0221072 A1 | 9/2011 | Chin |
| 2011/0287606 A1 | 11/2011 | Brun et al. |
| 2011/0300668 A1 | 12/2011 | Parvarandeh |
| 2011/0304036 A1 | 12/2011 | Son |
| 2011/0309523 A1* | 12/2011 | Takahashi ............ H01L 21/561 257/774 |
| 2012/0001339 A1 | 1/2012 | Malatkar |
| 2012/0020026 A1 | 1/2012 | Oganesian et al. |
| 2012/0049332 A1 | 3/2012 | Chen et al. |
| 2012/0061852 A1 | 3/2012 | Su et al. |
| 2012/0086135 A1 | 4/2012 | Thompson et al. |
| 2012/0091583 A1 | 4/2012 | Kawashita et al. |
| 2012/0101540 A1 | 4/2012 | O'Brien et al. |
| 2012/0104623 A1* | 5/2012 | Pagaila ................ H01L 23/13 257/774 |
| 2012/0106228 A1 | 5/2012 | Lee |
| 2012/0228778 A1 | 9/2012 | Kosenko et al. |
| 2012/0276733 A1 | 11/2012 | Saeki et al. |
| 2012/0295415 A1 | 11/2012 | Ono |
| 2012/0319267 A1* | 12/2012 | Moon ................ H01L 23/3128 257/713 |
| 2012/0319300 A1 | 12/2012 | Kim et al. |
| 2013/0010441 A1 | 1/2013 | Oganesian et al. |
| 2013/0014978 A1 | 1/2013 | Uzoh et al. |
| 2013/0032390 A1 | 2/2013 | Hu et al. |
| 2013/0069239 A1 | 3/2013 | Kim et al. |
| 2013/0082383 A1 | 4/2013 | Aoya |
| 2013/0082399 A1 | 4/2013 | Kim et al. |
| 2013/0087917 A1 | 4/2013 | Jee et al. |
| 2013/0093075 A1 | 4/2013 | Liu et al. |
| 2013/0099368 A1 | 4/2013 | Han |
| 2013/0105989 A1* | 5/2013 | Pagaila ................ H01L 21/56 257/774 |
| 2013/0119527 A1 | 5/2013 | Luo et al. |
| 2013/0119528 A1 | 5/2013 | Groothuis et al. |
| 2013/0146991 A1 | 6/2013 | Otremba et al. |
| 2013/0181354 A1 | 7/2013 | Khan et al. |
| 2013/0187292 A1 | 7/2013 | Semmelmeyer et al. |
| 2013/0228898 A1 | 9/2013 | Ide |
| 2013/0241026 A1 | 9/2013 | Or-Bach et al. |
| 2013/0267046 A1 | 10/2013 | Or-Bach et al. |
| 2013/0270660 A1 | 10/2013 | Bryzek et al. |
| 2013/0292840 A1 | 11/2013 | Shoemaker et al. |
| 2013/0313680 A1 | 11/2013 | Oganesian et al. |
| 2014/0036454 A1 | 2/2014 | Caskey et al. |
| 2014/0070380 A1 | 3/2014 | Chiu et al. |
| 2014/0091461 A1 | 4/2014 | Shen |
| 2014/0134803 A1 | 5/2014 | Kelly et al. |
| 2014/0134804 A1 | 5/2014 | Kelly et al. |
| 2014/0225244 A1 | 8/2014 | Smith et al. |
| 2014/0246227 A1 | 9/2014 | Lin et al. |
| 2014/0252655 A1 | 9/2014 | Tran et al. |
| 2014/0264811 A1 | 9/2014 | Wu |
| 2014/0319683 A1 | 10/2014 | Lin et al. |
| 2014/0361410 A1 | 12/2014 | Yamamichi et al. |
| 2015/0001731 A1 | 1/2015 | Shuto |
| 2015/0021755 A1 | 1/2015 | Hsiao et al. |
| 2015/0262902 A1 | 9/2015 | Shen et al. |
| 2015/0262928 A1 | 9/2015 | Shen et al. |
| 2015/0262972 A1 | 9/2015 | Katkar |
| 2016/0079214 A1 | 3/2016 | Caskey |

FOREIGN PATENT DOCUMENTS

| | | |
|---|---|---|
| WO | WO 2005/022630 A1 | 3/2005 |
| WO | WO 2006/124597 A2 | 11/2006 |
| WO | WO 2007/142721 A1 | 12/2007 |
| WO | WO 2009/070348 A1 | 6/2009 |
| WO | WO 2012/169162 A1 | 12/2012 |
| WO | WO 2013/062533 A1 | 5/2013 |

OTHER PUBLICATIONS

International Search Report mailed Sep. 21, 2015 for International Application No. PCT/US2015/033786, International Filing Date Feb. 6, 2015.

United States Patent and Trademark Office, First Action Interview Pilot Program Pre-Interview Communication, Mail Date Oct. 22, 2014, for U.S. Appl. No. 14/214,365, filed Mar. 14, 2014.

International Search Report and Written Opinion for PCT/US2015/032572 dated Nov. 23, 2015.

John H. Lau, "TSV Interposer: The most Cost-Effective Integrator for 30 IC Integration," Electronics & Optoelectronics Research Laboratories, Industrial Technology Research Institute (ITRI), retrieved on Feb. 24, 2015.

ChipScale Review, "The Impact of CSPs on Encapsulation Materials," ChipScale Review publication issue Mar. 1998, retrieved Feb. 21, 2014, 6 pages.

Dr. Paul A. Magill, "A New Thermal-Management Paradigm for Power Devices," Power Electronics Technology, Nov. 2008, pp. 26-30.

Herming Chiueh et al., "A Dynamic Thermal Management Circuit for System-On-Chip Designs," Analog Integrated Circuits and Signal Processing, 36, pp. 175-181, Jan. 25, 2003.

Hybrid Memory Cube Consortium, "Hybrid Memory Cube Specification 1.0," Last Revision Jan. 2013, 122 pages, Retrieved from: http://hybridmemorycube.org/specification-download/.

K. Zoschke et al., "Hermetic Wafer Level Packaging of MEMS Components Using Through Silicon Via and Wafer to Wafer Bonding Technologies" (2013 Electronic Components & Technology Conference, IEEE, pp. 1500-1507).

Lau et al., "Thin-Wafer Handling with a Heat-Spreader Wafer for 2.5D/3D IC Integration," 46th International Symposium on Microelectronics (IMAPS 2013) Sep. 30-Oct. 3, 2013, Orlando, FL USA, pp. 1-8 [389-396].

Li Shang et al., "Thermal Crisis: Challenges and Potential Solutions," Potentials, vol. 25, Issue 5, Sep./Oct. 2006, pp. 31-35.

Nakamura et al., "Technology Trends and Future History of Semiconductor Packaging Substrate Material," Hitachi Chemical Review Technical Report No. 55, May 2013, pp. 24-29.

Pulliam, Wayne, "Designing with BGAs," AMD presentation, 2008, 62 pages.

San Hwui Lee et al., "Wafer-to-Wafer Alignment for Three Dimensional Integration: A Review," Journal of Microelectromechanical Systems, vol. 20, Issue 4, Aug. 2011, pp. 885-898.

U.S. Appl. No. 14/201,585, filed Mar. 7, 2014.

U.S. Appl. No. 14/214,365 titled, "Integrated Circuits Protected by Substrates with Cavities, and Methods of Manufacture," filed Mar. 14, 2014, 40 pages.

Dreiza; Moody et al., "Joint Project for Mechanical Qualification of Next Generation High Density Package-on-Package (PoP) with Through Mold Via Technology," Amkor Technology, EMPC2009—17th European Microelectronics & Packaging Conference, Jun. 16th, Rimini, Italy, 8 pages.

Zwenger; Curtis et al., "Next Generation Package-on_Package (PoP) Platform with Through Mold Via (TMV™) Interconnection Technology," Amkor Technology, Originally published in the proceedings of the IMPAS Device Packaging Conference, Scottsdale, AZ, Mar. 10-12, 2009, 8 pages.

Kim; Jinseong et al., "Application of Through Mold Via (TMV) as PoP base package," Amkor Technology, 2008 IEEE Reprinted from ECTC2008 Proceedings, 6 pages.

U.S. Appl. No. 14/250,317 titled "Die Stacks With One or More Bond Via Arrays," filed Apr. 10, 2014, 58 pages.

Das; Rabindra N. et al., "Package-Interpose-Package (PIP) Technology for High End Electronics," Endicott Interconnect Technologies, Inc., retrieved Jul. 31, 2014, 4 pages.

McCormick; Heather et al., "Assembly and Reliability Assessment of Fine Pitch TMV Package on Package (PoP) Components," Amkor Technology Inc., Originally published in the Proceedings of the SMTA International Conference, San Diego, CA, Oct. 4-8, 2009, 8 pages.

(56) References Cited

OTHER PUBLICATIONS

Final Office Action dated Mar. 2, 2015 of U.S. Appl. No. 14/214,365.
Notice of Allowance dated Apr. 16, 2015 of U.S. Appl. No. 14/268,899.
A. Strandjord et al., "Bumping for WLCSP using Solder Ball Attach on electrolessss NiAu UBM", Pac Tech USA—Packaging Technologies, Inc., 29 pages, 2008.
M.A. Boyle et al., "Epoxy Resins", Composites, vol. 21, ASM Handbook, ASM International, p. 78-89, 2001.
U.S. Appl. No. 14/558,462 titled, "Interposers With Circuit Modules Encapsulated by Moldable Material in a Cavity, and Methods of Fabrication", filed Dec. 2, 2014.
K.T. Turner et al., "Mechanics of direct wafer bonding", Proc. R. Soc. A, 462, 171-188, Nov. 9, 2005.
Pre-Interview First Office Action dated Oct. 22, 2014 of U.S. Appl. No. 14/214,365.
U.S. Appl. No. 14/288,064 titled, "Integrated Circuit Assemblies With Reinforcement Frames, and Methods of Manufacture," filed May 27, 2014.
U.S. Appl. No. 14/268,899 titled, "Making Electrical Components in Handle Wafers of Integrated Circuit Packages," filed May 2, 2014.
International Search Report and Written Opinion, Aug. 6, 2015, 10 pages, PCT Patent Application No. PCT/US2015/028172.
International Search Report and Written Opinion for PCT/US2015/019609 dated May 12, 2015, 11 pages.
Office Action dated Jul. 9, 2015 for U.S. Appl. No. 14/558,462, 11 pages.
U.S. Appl. No. 14/214,365, filed Mar. 14, 2014.
Hybrid Memory Cube Consortium, "Hybrid Memory Cube Specification 1.0," Last Revision Jan. 2013, 122 pages, Retrieved from: http://hybridmemorycube.org/specificationdownload/.

\* cited by examiner

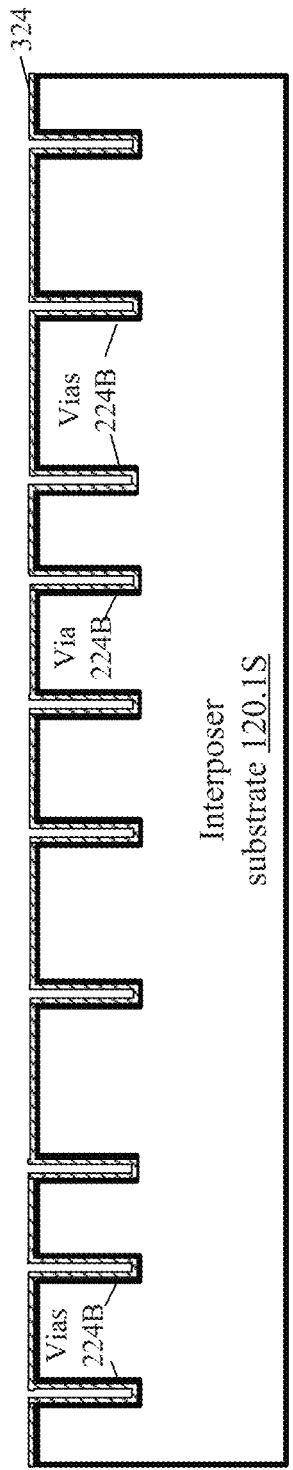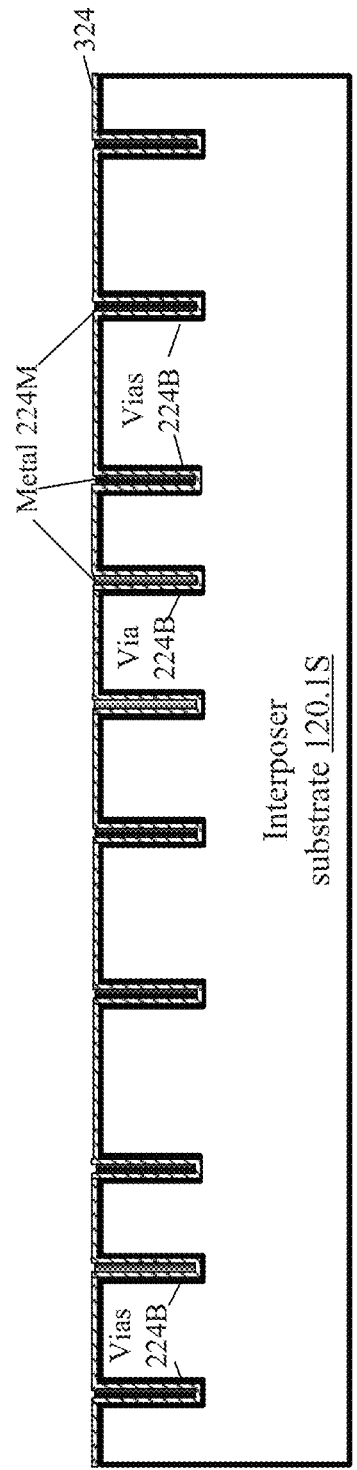

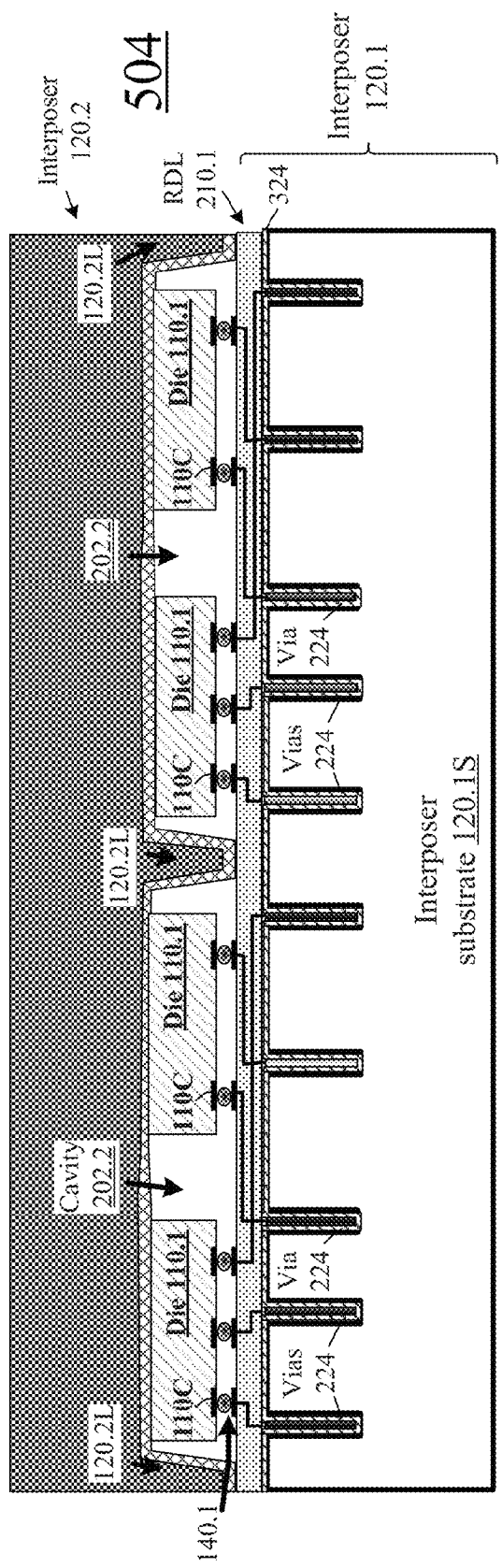
FIG. 5A.1
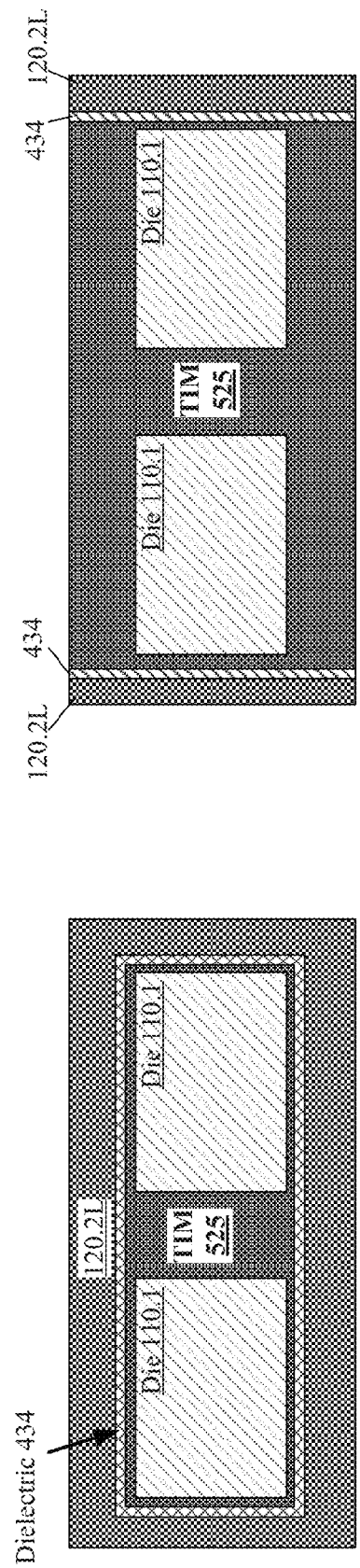
FIG. 5A.3
FIG. 5A.2

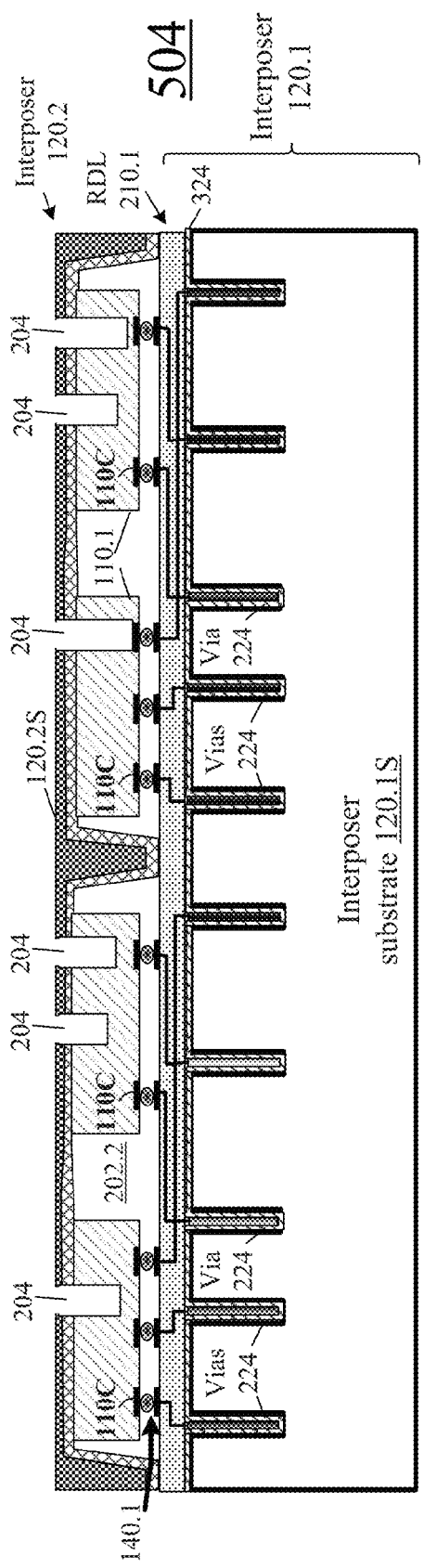
FIG. 5C.1
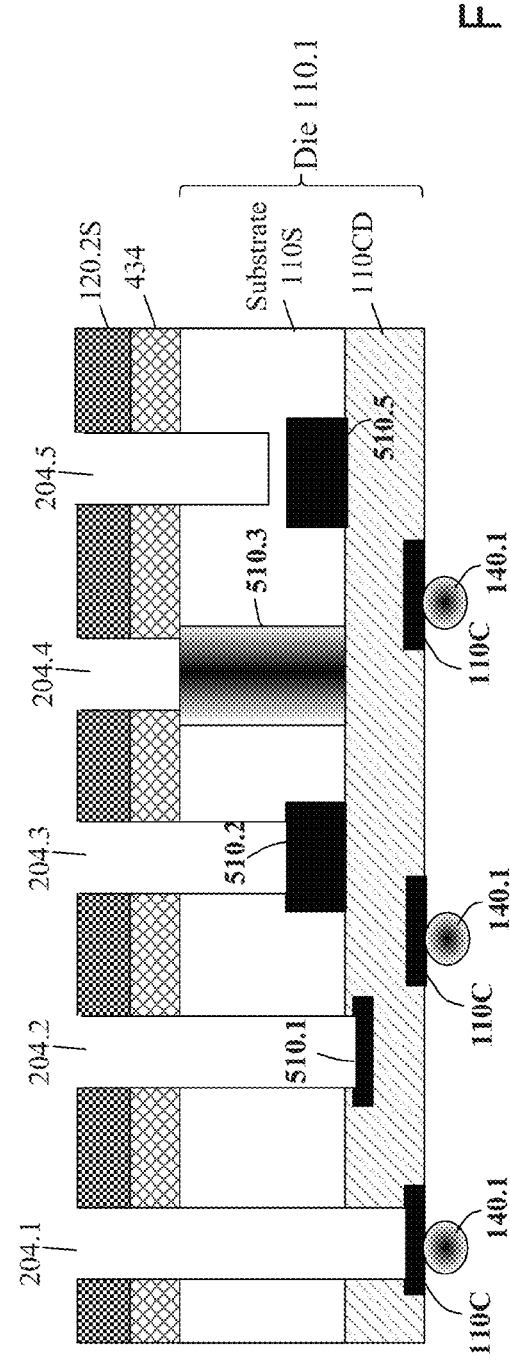
FIG. 5C.2

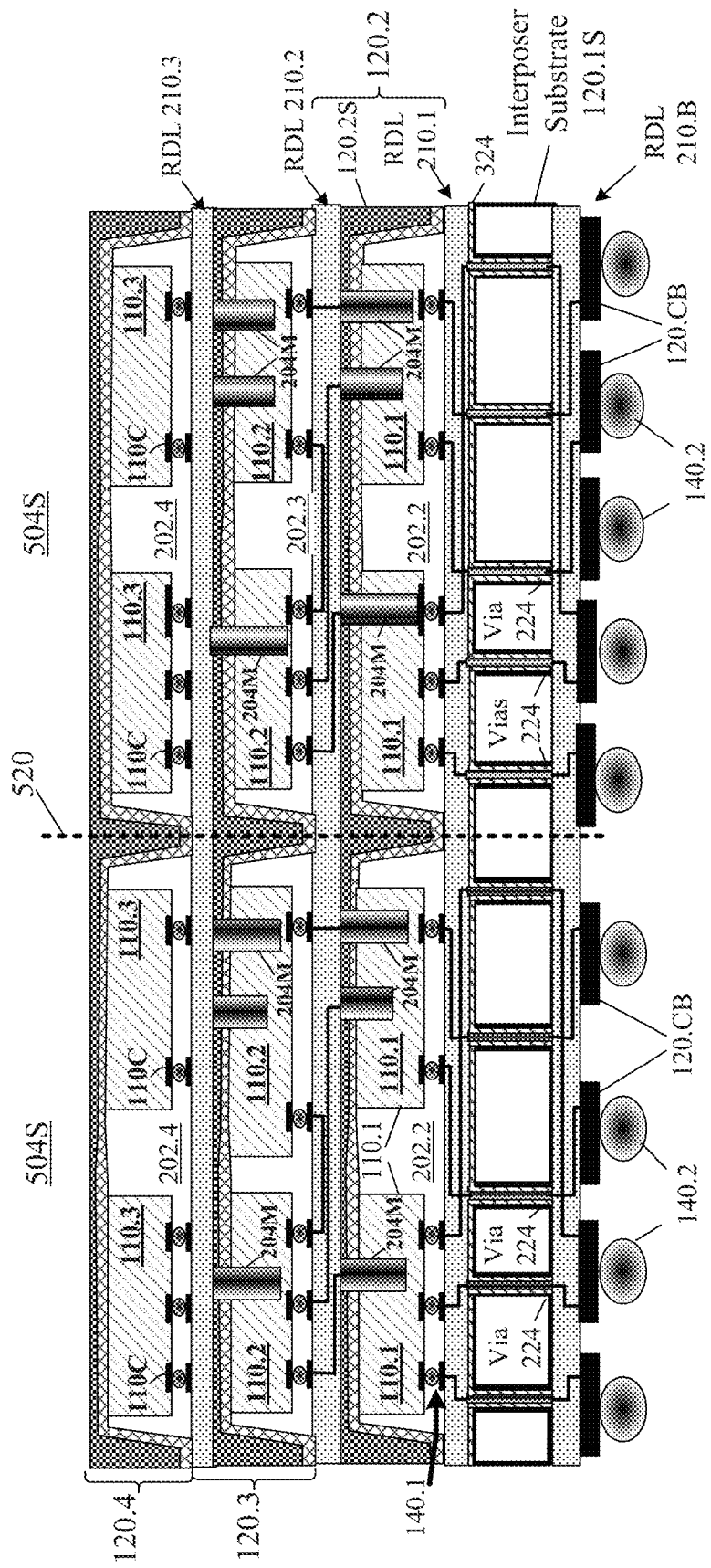

MICROELECTRONIC ASSEMBLIES WITH INTEGRATED CIRCUITS AND INTERPOSERS WITH CAVITIES, AND METHODS OF MANUFACTURE

CROSS-REFERENCE TO RELATED APPLICATIONS

The present application is a division of U.S. patent application Ser. No. 14/328,380, filed Jul. 10, 2014, incorporated herein by reference.

BACKGROUND OF THE INVENTION

This document relates to semiconductor integrated circuits (ICs), and more particularly to assemblies with semiconductor integrated circuits.

Multiple ICs can be combined in a high-density assembly to provide needed functionality. High density is desired for small assembly size and also to shorten electrical paths as needed for high speed and low power consumption. However, a small IC is a fragile device with tiny, densely packed contact pads which must be connected to possibly larger contact pads of other integrated or non-integrated (discrete) circuits. To enable such connections, an intermediate IC (interposer) can be provided. Interposers may also increase the mechanical strength of the assembly, absorb stresses generated due to differences in coefficients of thermal expansion (CTE), and improve the ability to dissipate heat that can be generated during operation or manufacture. However, interposers increase the assembly size and complexity, and they should be as thin as possible to shorten the electrical connections through the interposers.

FIG. 1 illustrates an exemplary assembly 102 with interposers as described in U.S. pre-grant patent publication 2007/0235850 by Gerber et al., published Oct. 11, 2007, incorporated herein by reference. The assembly is connected to external devices 104.2, 104.1 by large solder balls 108. The assembly includes ICs 110.1, 110.2 attached from the bottom to respective larger ICs (interposers) 120.1, 120.2. A typical IC is fabricated in a wafer, and an IC can occupy a whole wafer, but an IC can also be part ("chip" or "die") of a wafer. In FIG. 1, ICs 110 (i.e. 110.1, 110.2) are dies attached to the interposers by connections 140 which are smaller, and denser packed than solder connections 108. Interposers 120 are thicker and wider than dies 110.

In regions not occupied by die 110.2, interposer 120.2 is connected to interposer 120.1 by studs 154. In regions not occupied by die 110.1, interposer 120.1 is connected to an underlying insulator-based substrate 160 by other studs 154.

Each interposer 120 includes interconnects 158 each of which goes through the interposer and interconnects the interposer's circuits (not shown) coupled to connections 108, 140, 154. Insulator-based substrate 160 includes similar interconnects 164.

In manufacturing, ICs 110 and 120 and substrate 160 are separately manufactured and then attached to each other. Then the portion of assembly 102 above the substrate 160 is covered by an encapsulant (e.g. molding compound) 180 to mechanically strengthen the assembly. The assembly is then attached to external devices 104.

As noted above, it is desirable to reduce CTE mismatches, and thus the ICs 110 and 120 and the encapsulant 180 should preferably be made of materials with similar CTEs. However, a typical encapsulant (epoxy) has a much higher CTE than many ICs based on semiconductor materials such as silicon, so there is a need to reduce the encapsulant amount while still obtaining a robust assembly. Also, it is desirable to improve the mechanical strength and heat dissipation of intermediate structures obtained during manufacturing as well as the final structure.

SUMMARY

This section summarizes some features of the invention. Other features may be described in the subsequent sections. The invention is defined by the appended claims, which are incorporated into this section by reference.

Some manufacturing techniques described below reduce the assembly size and improve the mechanical strength and heat-dissipation capabilities of IC assemblies and intermediate structures. For example, in some embodiments, the structure of FIG. 1 is modified by providing the interposer 120.2 with a cavity on the bottom (shown as cavity 202.2 in FIG. 2), and the die 110.2 can be placed in the cavity; or the die can be placed in a cavity 202.1 in the top surface of interposer 120.1; in FIG. 2, the die enters both cavities. Therefore, the interposers 120.1 and 120.2 can be brought closer together, shortening the studs 154 interconnecting the two interposers. The assembly size is reduced, and so is the amount of encapsulant 180 (the encapsulant amount can be reduced both in the absolute terms and in the relative terms, i.e. measured as a fraction of the assembly volume). The mechanical strength is increased, partly because of the reduced size (and in particular shorter studs 154) and partly because a smaller fraction of the assembly volume is taken by the encapsulant which is softer than other parts of the assembly.

Due to the increased strength, it is easier to manufacture other circuits on interposers 120.1 and 120.2 after their attachment to each other and to dies 110.1 and 110.2. For example, in some embodiments, after the attachment, holes 204 are formed through the interposers 120.1 and 120.2, or through part of the interposers (e.g. through the interposers' substrates) to extend into the die 110.2, and conductive vias are formed in the holes. Then other ICs (such as 110.1 and 110.3) or IC assemblies are attached to the top surface of interposer 120.2 and the bottom surface of interposer 120.1 and electrically connected to the conductive vias in holes 204. Further, in some embodiments, attachment of dies 110.3 can be performed before dicing of interposers 120.1 and 120.2, when the two interposers are still part of standard-size wafers: manufacturing is simplified when performed on standard-size structures. For example, circuit elements such as transistors, capacitors, interconnects, etc. (not shown) can be formed on interposer 120.2 before and/or after the attachment of IC 110.3. Of note, even though the interposer 120.2 has a cavity on the bottom, the interposer's top surface can be planar, facilitating fabrication of holes 204 and other circuit elements and the attachment of IC 110.3.

In some embodiments, the die 110.2 has contact pads connected to interposer 120.1. In some embodiments, the die 110.2 is placed in a through-hole in interposer 120.2.

The invention is not limited to the features and advantages described above except as defined by the appended claims.

BRIEF DESCRIPTION OF THE DRAWINGS

FIGS. 2, 3A, 3B, 3C, 3D, 3E, 4A, 4B, 4C, 5A.1 illustrate vertical cross-sections of structures according to some embodiments as set forth in detail below.

FIGS. 5A.2 and 5A.3 are bottom views of horizontal cross sections according to some embodiments as set forth in detail below.

FIGS. 5B, 5C.1, 5C.2, 5D, 5E, 5F, 5G, 5H, 6, 7, 8, 9, 10, 11, 12, 13 illustrate vertical cross-sections of structures according to some embodiments as set forth in detail below.

DESCRIPTION OF SOME EMBODIMENTS

The embodiments described in this section illustrate but do not limit the invention. The invention is defined by the appended claims.

Figure 3A:
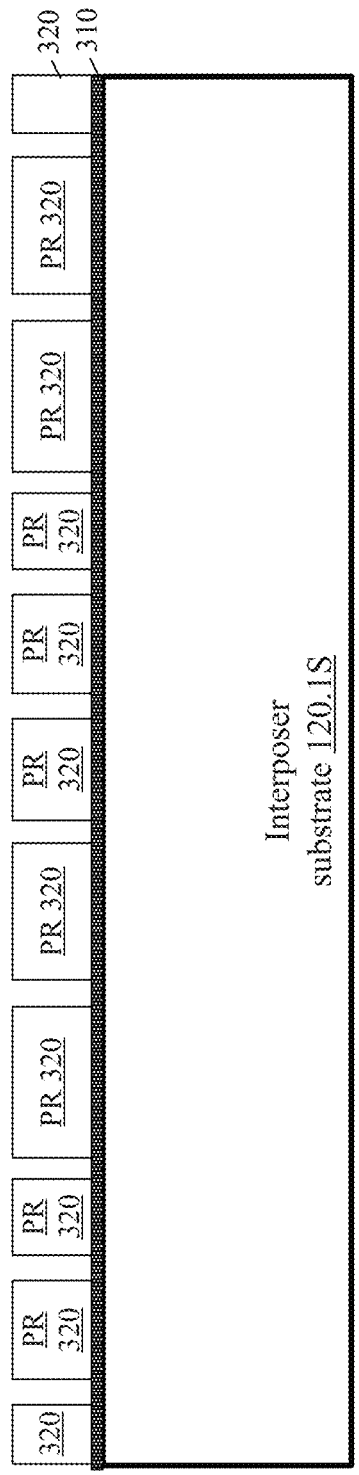

FIG. 3A shows the beginning stages of fabrication of an interposer 120.1 according to some embodiments of the present invention. The beginning and other stages are similar to those described in U.S. patent application Ser. No. 14/214,365, filed Mar. 14, 2014 by Invensas Corporation, and U.S. provisional patent application No. 61/952,066, filed Mar. 12, 2014 by Shen et al., both incorporated herein by reference. The interposer substrate 120.15 is initially chosen to be sufficiently thick to provide easy handling and adequate heat dissipation in fabrication. In some embodiments, substrate 120.15 is a monocrystalline silicon wafer of a 200 mm or 300 mm diameter and a thickness of 650 micron or more. These materials and dimensions are exemplary and do not limit the invention. For example, substrate 120.15 can be made of other semiconductor materials (e.g. gallium arsenide), or glass, or sapphire, or metal, or possibly other materials. Possible materials include NbTaN and LiTaN. The substrate will later be thinned; for example, in case of silicon, the final thickness could be 5 to 50 microns. Again, these dimensions are not limiting.

Figure 3B:
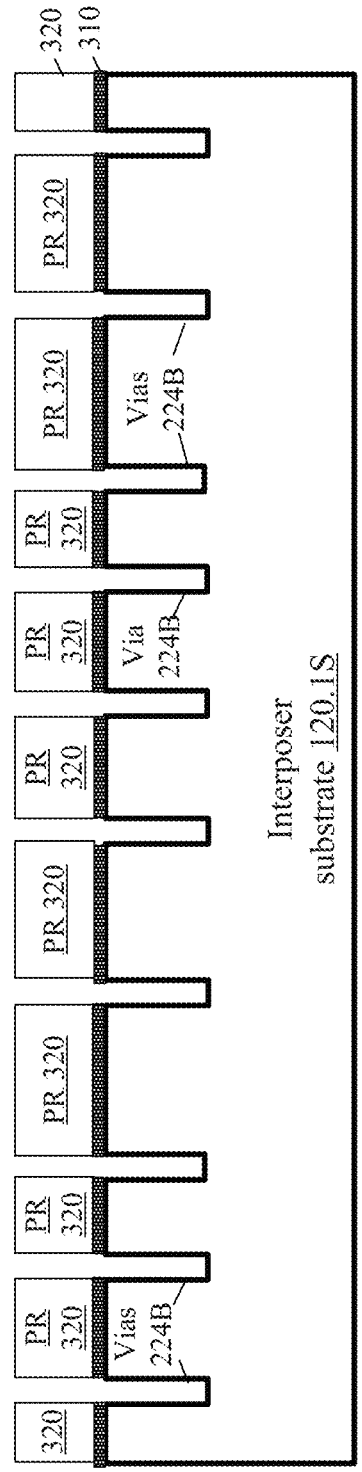

Substrate 120.1S is patterned to form blind vias 224B (FIG. 3B). "Blind" means that the vias do not go through substrate 120.1S. This can be done, for example, as follows for silicon substrates. First, optional layer 310 (FIG. 3A) is formed on substrate 120.15 to protect the substrate and/or improve the adhesion of subsequently formed photoresist 320. For example, layer 310 can be silicon dioxide formed by thermal oxidation, chemical vapor deposition (CVD), or sputtering. Then photoresist 320 is deposited and photolithographically patterned to define the vias. Layer 310 and substrate 120.1S are etched in areas exposed by resist 320 to form the blind vias. The via depth is equal or slightly greater than the final depth of substrate 120.1S, e.g. 5 to 51 microns for some silicon-substrate embodiments. The vias can be formed by a dry etch, e.g. dry reactive ion etching (DRIE). An exemplary diameter of each via can be 60 microns or less, but other dimensions are possible. The vias can be vertical (as shown) or may have sloped sidewalls. As noted above, the particular dimensions, processes and other features are illustrative and not limiting. For example, the vias can be laser-drilled or made by some other process.

The vias are then metallized. If substrate 120.1S is silicon, this can be done as follows. Photoresist 320 and protective layer 310 are removed, and a dielectric layer 324 (FIG. 3C) is formed on the entire top surface of substrate 120.15. Dielectric 324 lines the via surfaces. In some embodiments, dielectric 324 is formed by thermal oxidation of the silicon substrate or by CVD or physical vapor deposition (PVD). Dielectric 324 will electrically insulate the substrate from subsequently formed metal in vias 224B. The dielectric thickness depends on the desired process parameters, and is 1 micron in an exemplary thermal-oxide embodiment (a thermal oxide is silicon dioxide formed by thermal oxidation). Other dimensions and materials can be used instead. Dielectric 324 can be omitted if substrate 120.15 is itself dielectric.

Then metal 224M (FIG. 3D) is formed in vias 224B over the dielectric 324. In the embodiment shown, metal 224M fills up the vias, but in other embodiments the metal is a liner on the via surfaces. In an exemplary embodiment, metal 224M is electroplated copper. For example, a barrier layer (metal or dielectric, not shown separately) is formed first on dielectric 324 to aid in copper adhesion and prevent copper diffusion into the dielectric 324 or substrate 120.15. Suitable barrier layers may include a layer of titanium-tungsten (see Kosenko et al., US pre-grant patent publication 2012/0228778 published Sep. 13, 2012, incorporated herein by reference), and/or nickel containing layers (Uzoh et al., US 2013/0014978 published Jan. 17, 2013, incorporated herein by reference). Then a seed layer, e.g. copper, is formed on the barrier layer by PVD (possibly sputtering). Then copper is electroplated on the seed layer to fill the vias 224B and cover the whole substrate 120.15. The copper is then removed from the areas between the vias by chemical mechanical polishing (CMP). Optionally, the CMP may also remove the barrier layer (if present) from these areas, and may stop on dielectric 324. As a result, the copper and the barrier layer remain only in and over the vias 224B.

Bellow, numeral 224 can refer to the metallized vias. For ease of description, we will refer to vias 224 as "metallized", but non-metal conductive materials can also be used (e.g. doped polysilicon). A conductive via (the feature formed of conductive material) 224M can be analogized to a whole or part of an interconnect 158 of FIG. 2.

If layer 224M does not fill the vias but is only a liner on the via surfaces, some other material (not shown) can be formed on layer 224M as a filler to fill the vias and provide a planar top surface for the wafer. This filler material can be polyimide deposited by spin coating for example.

Figure 2:
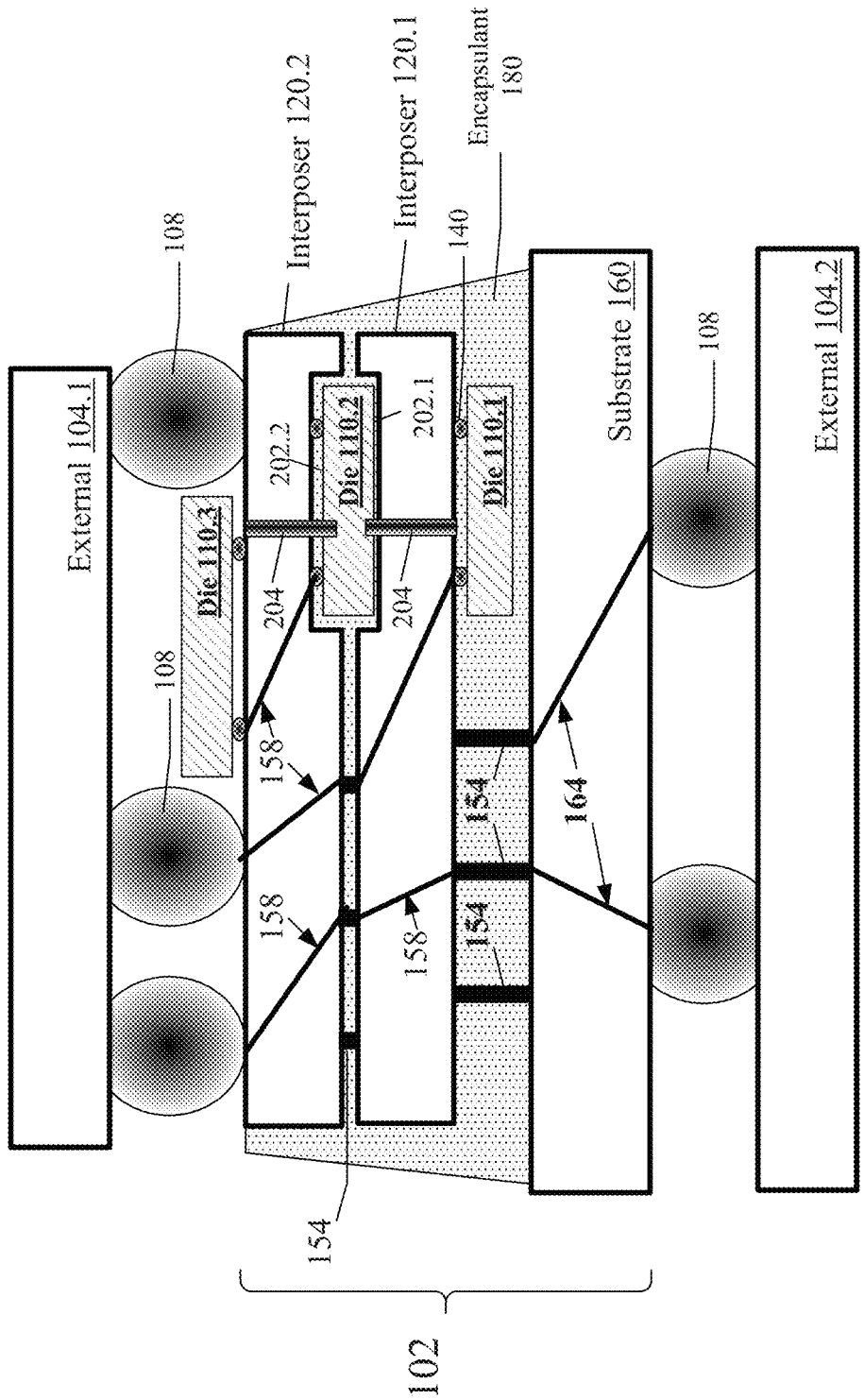
Figure 3E:
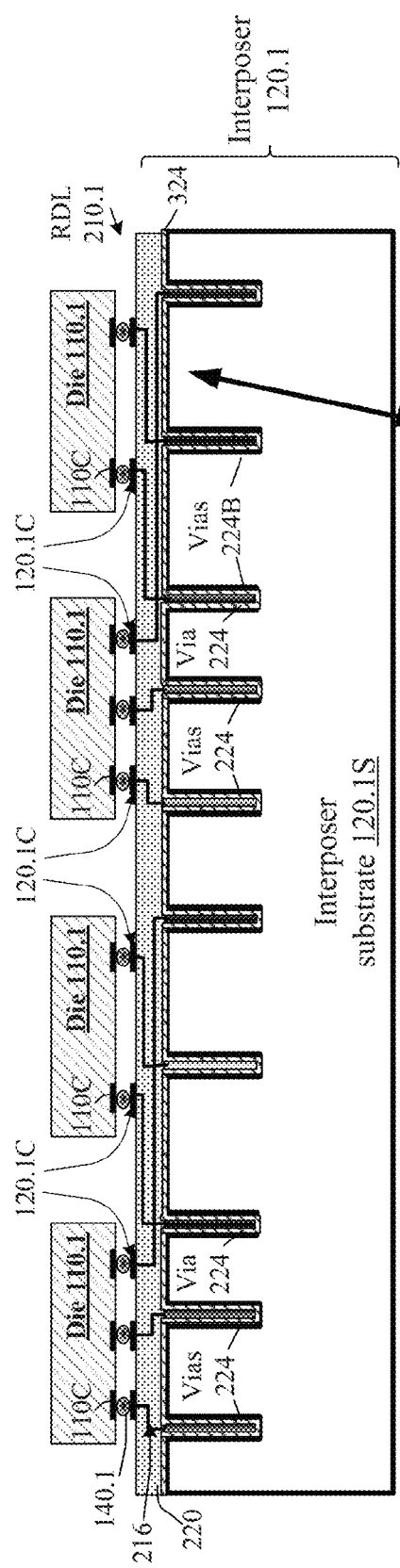
Figure 3E:
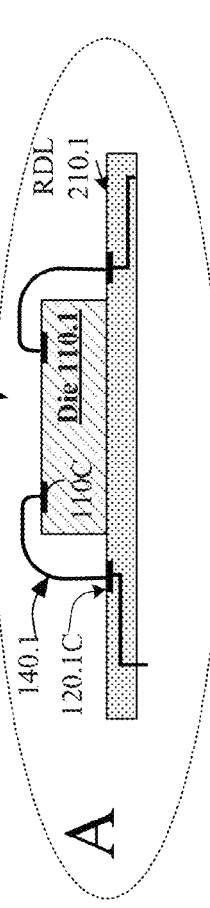

Optionally, as shown in FIG. 3E, redistribution layer (RDL) 210.1 is formed on top of substrate 120.1S to provide contact pads 120.1C at desired locations. The contact pads can later be attached to studs 154 (FIG. 2), or to connections 140 attached to dies on top of the interposer, or other types of connections (the interposer 120.1 of FIG. 2 does not have dies attached to the top surface, but dies or multi-die assemblies can be attached to the top surface if desired). Contact pads 120.1C can also be attached to discrete wires connecting the interposer to other circuits. RDL 210.1 includes interconnect lines 216 insulated from each other and from substrate 120.1S by the RDL's dielectric 220. Interconnect lines 216 can be thought of as parts of interconnects 158 of FIG. 2. RDL 210.1 can be formed by prior art or other techniques. RDL 210.1 is omitted if the contact pads 120.1C are provided by the top areas of metal 224M. In such a case, if substrate 120.15 is not dielectric, then a dielectric layer can be formed on the substrate and photolithographically patterned to expose the contact pads 120.1C.

Interposer 120.1 may include transistors, resistors, capacitors, and other devices (not shown) in substrate 120.15 and redistribution layer 210.1. These devices can be formed before, during and/or after the fabrication of vias 224 and RDL 210.1 using the process steps described above and/or additional process steps. Such fabrication techniques are well known. See e.g. the U.S. Pat. No. 6,958,285 issued Oct. 25, 2005 to Siniaguine, and U.S. pre-grant patent publication 2012/0228778 by Kosenko et al. published Sep. 13, 2012, both incorporated herein by reference.

Dies 110.1 are attached to interposer 120.1 and connected to contact pads 120.1C. More particularly, dies 110.1 have circuitry (not shown) electrically coupled to contact pads 110C, and the contact pads 110C are connected to respective contact pads 120.1C by connections 140.1 (possibly of the type described above for connections 140 or 154); the attachment can use prior art methods (e.g. as in FIG. 1) or other methods (e.g. diffusion bonding); in case of diffusion bonding, the connections 140.1 are not additional elements but are part of contact pads 110C and/or 120.1C. As shown in insert A, the dies may have contact pads 110C on top which are connected to contact pads 120.1C by discrete wires 140.1; the wires can be attached by ultrasound bonding, or by solder, or other methods. (Of note, studs 154 can also be formed as discrete wires, possibly of the type described in U.S. pre-grant patent publication 2014/0036454 (Feb. 6, 2014, Caskey et al., entitled "BVA Interposer", incorporated herein by reference.) The die-to-interposer attachment can be by dielectric adhesive for example.

Figure 1:
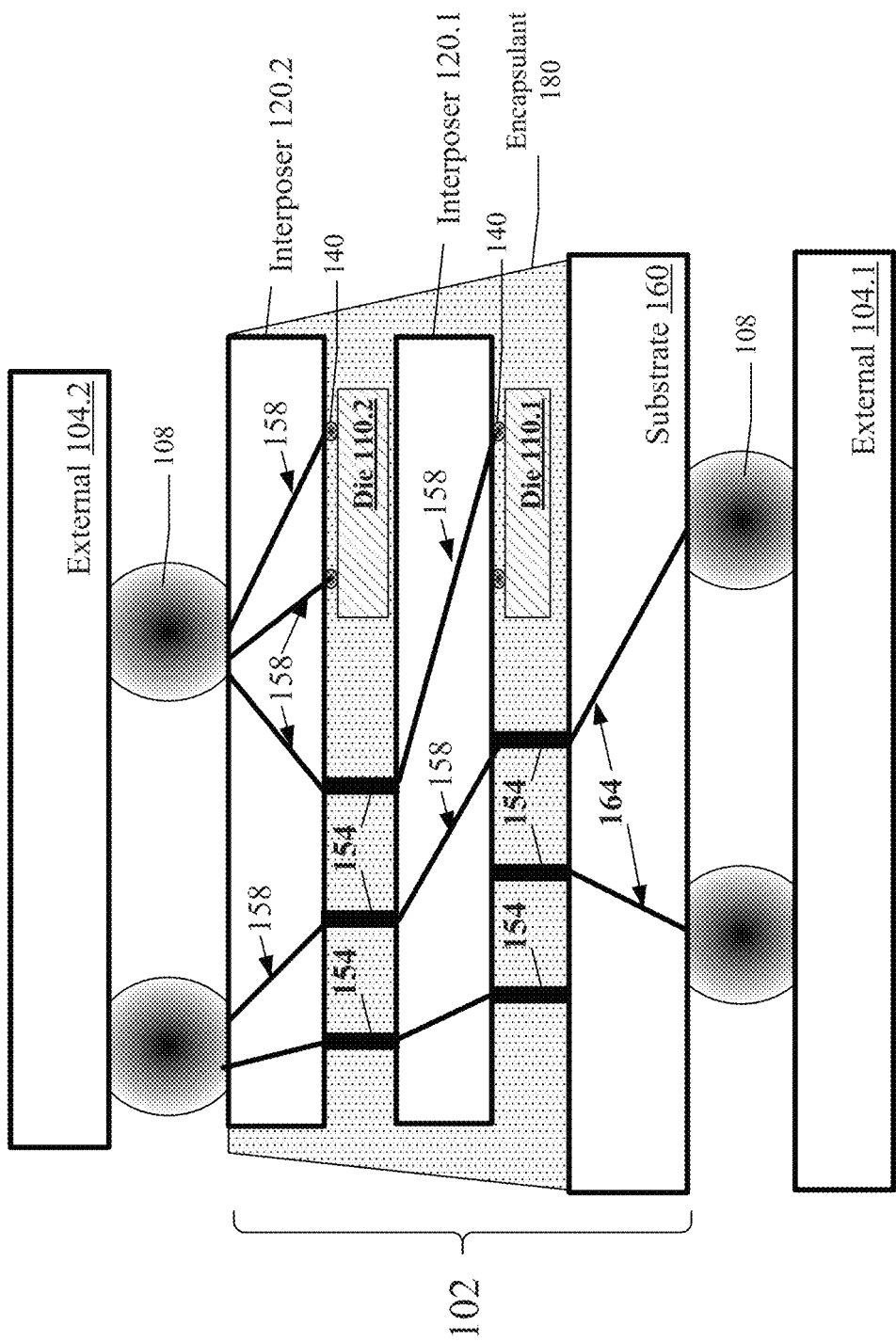
FIG. 1 illustrates a vertical cross-section of assemblies including integrated circuits and constructed according to prior art.

Throughout this disclosure, dies 110.1 can be replaced by IC assemblies such as, for example, the assembly 102 of FIG. 1 or 2; an entire assembly can be connected to contact pads 120.1C.

Optionally, an encapsulant (not shown) can be formed under the dies (as underfill) and/or around the dies (to completely or partially cover the dies' sidewalls), and perhaps above the dies (to completely cover the dies' top and sidewall surfaces), possibly by prior art techniques (e.g. including molding and/or capillary action for underfill and/or pre-deposited underfill). The encapsulant can be any suitable material (e.g. epoxy with silica or other particles, or non-conducting film for the underfill) or a combination of materials. No encapsulant is used in some embodiments. Other embodiments use an encapsulant, but the requirements for the encapsulant are relaxed because the assembly will be strengthened by one or more other interposers closely positioned with respect to interposer 120.1 (see FIG. 2 for example). In some embodiments, the encapsulant is provided only underneath the dies (as underfill), i.e. only between the dies and substrate 120.1S (around the connections 140.1).

Figure 4A:
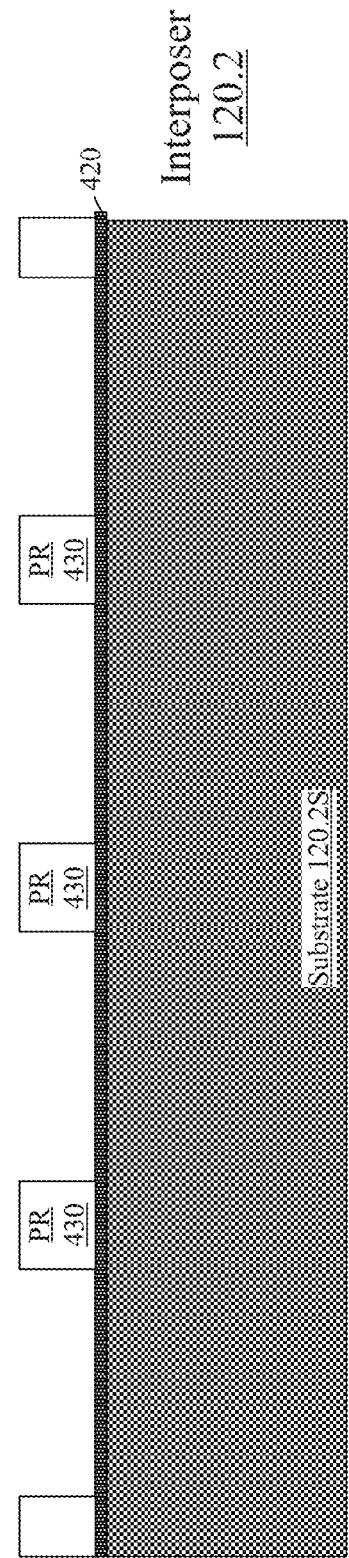
Figure 4B:
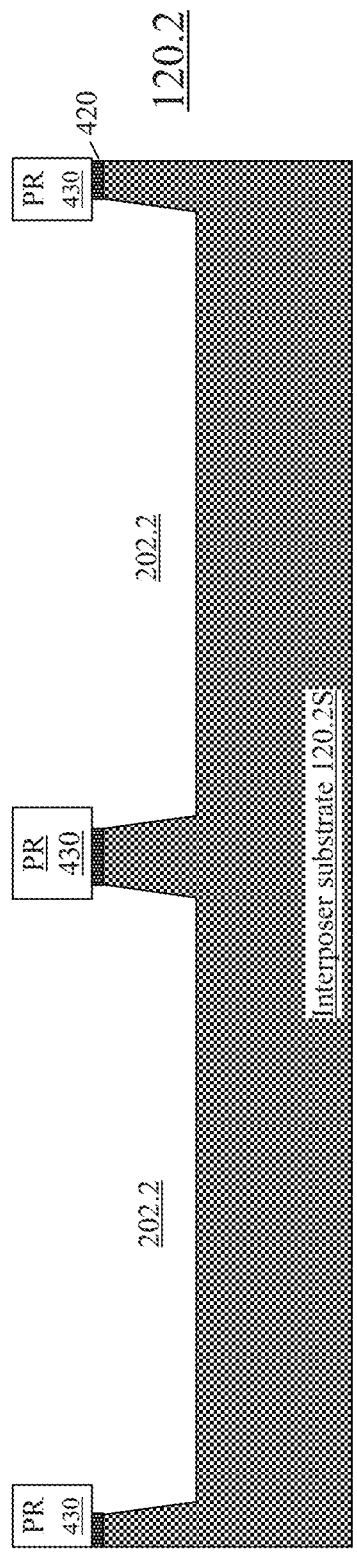
Figure 4C:
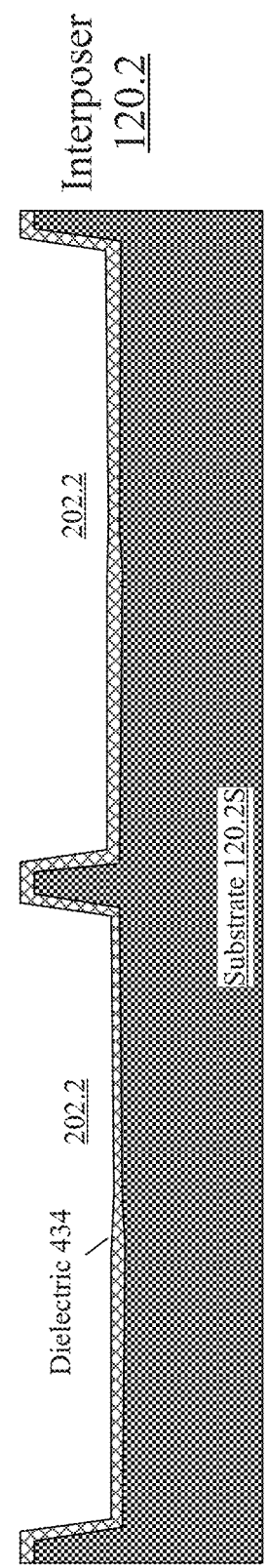

In the embodiment being described, interposer 120.1 does not have any cavities (such as cavity 202.1 in FIG. 2), but one or more cavities can be provided, possibly by known techniques, as illustrated immediately below on the example of interposer 120.2 (FIGS. 4A-4C).

Just like interposer 120.1, interposer 120.2 may be provided with circuits including transistors, resistors, capacitors, and/or other elements. Circuitry can be manufactured in interposer 120.2 before and/or after the attachment to interposer 120.1.

Interposer 120.2 should be sufficiently rigid to facilitate subsequent handling of the assembly as explained below. In the embodiment shown, interposer 120.2 includes monocrystalline silicon substrate 120.2S of a thickness 650 microns or higher. Other materials (e.g. glass, metal, polymer plastic, and others) and thicknesses are possible, based on any factors that may be important (including the availability of materials and processes). One possible factor is reducing the mismatch of the coefficients of thermal expansion (CTE) between substrates 120.2S and 120.1S: if substrate 120.1S is silicon, then substrate 120.2S could be silicon or another material with a similar CTE. Another factor is reducing the CTE mismatch between interposer 120.2 and dies 110.1 (especially if the dies may physically contact the interposer 120.2 or may be attached to interposer 120.2). The choice of materials can also be affected by the type of circuitry that must be provided in interposer 120.2.

Another possible factor is high thermal conductivity to better enable the interposer 120.2 to conduct heat to the ambient. For example, metal may be appropriate.

Openings 202.2 (FIG. 4C) are cavities formed in interposer 120.2 to match the size and position of dies 110.1. An exemplary process is as follows (this process is appropriate for a silicon substrate 120.2S, and may be inappropriate for other materials; known processes can be used for silicon or other materials). First, an auxiliary layer 420 (FIG. 4A) is formed to cover the substrate 120.2S for protection or for improved adhesion of subsequently formed photoresist 430. Resist 430 is then deposited and patterned photolithographically to define the cavities 202.2. Auxiliary layer 420 exposed by the resist openings is etched away. Then (FIG. 4B) substrate 120.2S is etched in these openings to form cavities 202.2 with sloped, upward-expanding sidewalls (e.g. by a wet etch). The cavity depth depends on the thickness of dies 202.2 and connections 140.1 as explained below. Non-sloped (vertical) sidewalls can also be obtained, by an anisotropic dry etch for example. Retrograde sidewalls or other sidewall profiles are also possible.

Then photoresist 430 is removed (FIG. 4C). In the example shown, auxiliary layer 420 is also removed, but in other embodiments layer 420 remains in the final structure.

Optionally, a dielectric 434, e.g. silicon dioxide or polyimide, is formed to cover the substrate surface by any suitable techniques (e.g. sputtering, or thermal oxidation if substrate 120.2S is silicon).

As shown in FIG. 5A.1, interposer 120.2 is attached to interposer 120.1; each die 110.1 fits into a respective cavity 202.2. More particularly, legs 120.2L of interposer 120.2 are attached to the top surface of interposer 120.1 (e.g. to RDL 210.1 if the RDL is present; legs 120.2L are those portion(s) of interposer 120.2 that surround the cavities). The interposer attachment is shown as direct bonding, but other types of attachments (e.g. by adhesive) can also be used. The entire assembly is marked with numeral 504.

In this embodiment, the interposers are attached without being electrically interconnected, and in fact no circuitry has been manufactured in interposer 120.2 at this stage. In other embodiments, circuitry has been manufactured in interposer 120.2, possibly with contact pads in legs 120.2L, and these contact pads can be connected to contact pads in interposer 120.1 with studs 154 of FIG. 2 or other types of connections (possibly using solder, diffusion bonding, or other types).

In FIG. 5A.1, the dies' top surfaces physically contact the top surfaces of cavities 202.2 (i.e. the layer 434), and the dies may be bonded to layer 434 by direct bonding. Alternatively, the bonding can be by adhesive; the adhesive can be dielectric or anisotropic so as not to short together the subsequently formed conductive vias in holes 204 (see FIG. 2). Alternatively, conductive adhesive can be used if it is limited to the vicinity of holes 204 so as not to short together the conductive vias.

Bonding of dies 110.1 to the cavity surfaces increases the bonding strength between the interposers 120.1, 120.2 and improves the thermal conductivity of the thermal path from the dies to interposer 120.2.

As noted above, in some embodiments the dies are underfilled and/or encapsulated from above by a suitable protective material (not shown in FIG. 5A.1), e.g. the same material as in encapsulant 180 in FIG. 1. In case of encapsulation from above, the cured encapsulant may be a solid material (possibly thermosetting) physically contacting the top surfaces of cavities 202.2. The encapsulant may be bonded to the cavity surfaces as described above, with benefits similar to those described above for the no-encapsulant embodiments.

In some embodiments, the cavities 202.2 are of uniform depth, and the top surfaces of the dies (or encapsulant) may be provided with uniform height. To improve the height uniformity, the dies (or encapsulant) can be polished before joining of interposer 120.2 to interposer 120.1. Suitable polishing processes include lapping, grinding, and chemical mechanical polishing (CMP). Also, temperature interface material (TIM, not shown here but shown at 525 in FIGS. 5A.2 and 5A.3 discussed below) can be placed in the cavities to improve thermal transfer between the dies and interposer 120.2. TIM's thermal conductivity can usually be higher than that of air. Exemplary TIMs are those that exist in semisolid, gel-like (grease-like) state throughout the range of expected operating temperatures (e.g. 0° C. to 200° C. for some assemblies) or at least when the temperatures are high to make die cooling particularly desirable (20° C. to 200° C. for some assemblies). The gel-like materials fill free spaces between the dies and interposer 120.2 to provide a thermally conductive path away from the dies. An exemplary TIM material is a thermal grease available from Arctic Silver, Inc. (having an office in California, USA); the grease's thermal conductivity is 1 W/mK.

In some embodiments, substrate 120.2S and/or layer 434 is soft and capable to deform to accommodate the height variations in dies 110.1. In some embodiments, possibly before the dies are attached to the interposer 120.1, the dies' surfaces (top surfaces in FIG. 5A.1) are provided with a soft dielectric layer (not shown, possibly polyimide or epoxy or other polymer) to facilitate fitting the dies to cavities 202.2 in view of height variations. In some embodiments, a semisolid material such as resin is used, which is cured after the interposer-to-interposer attachment. In some embodiments, a soft dielectric (not shown) is formed on the top surface of interposer 120.1 and dies 110.1 after the die attachment to the interposer, at the stage of FIG. 3E, and is possibly polished.

FIG. 5A.2 shows a possible bottom view of the horizontal cross section passing through the dies of the structure of FIG. 5A.1 (only half of the cross section is shown, with just one cavity). In the example of FIG. 5A.2, the dies are surrounded by thermal interface material (TIM) 525. The legs 120.2L form a region completely surrounding each cavity, and the interposer 120.1 area bonded to the legs also completely surrounds each cavity.

FIG. 5A.3 shows another possible bottom view of the same horizontal cross section, also with TIM 525. In this example, the legs 120.2L are provided only on two opposite sides of each cavity (left and right sides) but are not provided above and below. Each cavity 202.2 is a horizontal groove in substrate 120.2S, containing possibly other dies (any cavity 202.2 may also have only one die). The groove may run through the entire substrate 120.2S. Other cavity shapes are also possible.

Figure 5B:
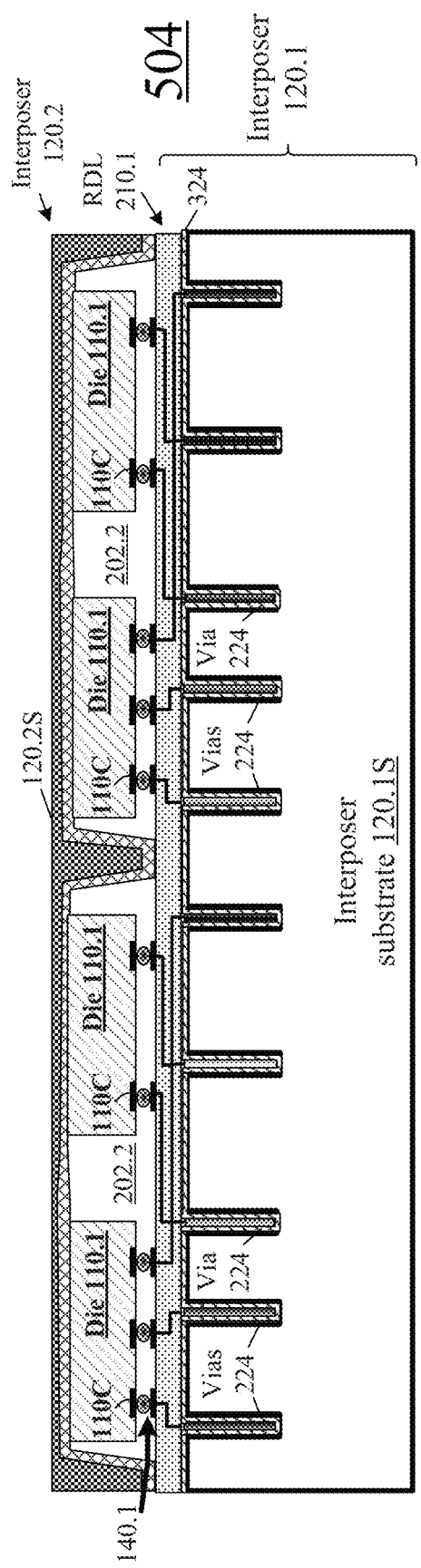

After the bonding of interposer 120.2 to interposer 120.1, interposer 120.2 is optionally thinned from the top; see FIG. 5B. The thinning can be performed by chemical etching, mechanical grinding, a combination of the two (e.g. chemical mechanical polishing), or possibly other processes. In some embodiments, the initially thickness of interposer 120.2S made of silicon is 2 to 1000 microns (e.g. 650 to 750 microns), the cavity depth is 1 to 998 microns, and the final thickness of interposer substrate 120.2S above the cavities is 1 to 999 microns. These dimensions are for illustration only and are not limiting. Of note, the structure remains strong due in part to the high thickness of interposer 120.1 (this interposer will be thinned later).

In some embodiments, the top surface of interposer 120.2 remains planar. Interposers 120.1 and 120.2 have not been diced, so the lateral shape of the assembly can be the same as of a standard wafer. These particulars are not limiting.

Now additional circuits (not shown) can be fabricated on top of interposer 120.2 and connected to dies 110.1 and/or interposer 120.1 by conductive vias passing through holes 204 (see FIGS. 2 and 5C.1). Holes 204 can be formed using known techniques, e.g. laser drilling or etching, or laser drilling followed by etching, or other processes. If etching is used and an etch mask is desired, the etch mask (not shown) can be formed using photoresist by known techniques. The holes 204 may terminate at any desired point, and different holes may have different depths; some examples are illustrated in FIG. 5C.2 showing a die 110.1 on a larger scale. In this example, the die has a semiconductor substrate 1105 (e.g. monocrystalline silicon) and conductive and dielectric layers 110CD formed on the substrate's bottom surface and providing the contact pads 110C. The die may include transistors, resistors, and other kinds of circuit elements. Hole 204.1 terminates at a contact pad 110C. Hole 204.2 terminates at some other conductor or semiconductor feature 510.1 in layers 110CD. Hole 204.3 terminates at a feature 510.2 in substrate 1105. For example, feature 510.2 may be a transistor source or drain region or a trench formed in substrate 1105 and filled with a conductive material, possibly metal, possibly insulated from substrate 1105 by a dielectric layer (not shown).

Feature 510.3 is a metallized via formed through substrate 110S, and hole 204.4 terminates at the via, i.e. at the top surface of die 110.1. Hole 204.5 terminates above the feature 510.5 to provide capacitive coupling to the feature as described below. While the holes are shown above the respective features, a hole may also be on a side of a respective feature, to provide electrical coupling from the side. These examples are not limiting.

Figure 5D:
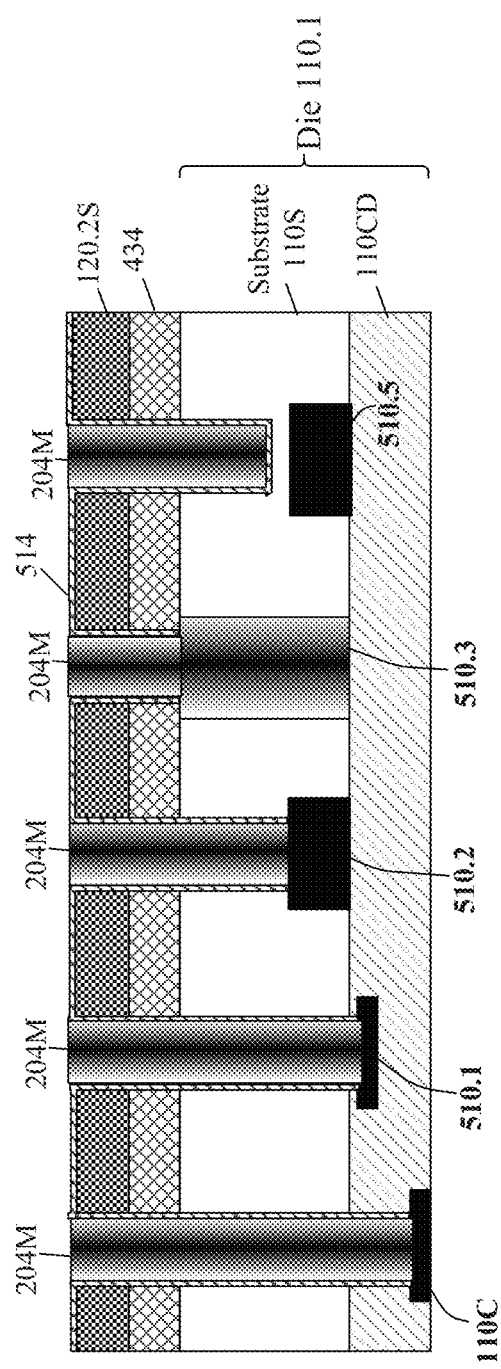

As shown in FIG. 5D (same view as in FIG. 5C.2 but without solder 140.1 and some of the contact pads 110C), conductive vias 204M are formed in holes 204. In some embodiments, conductive vias 204M are made by the same or similar process as described above for vias 224M. For example, dielectric 514 can be deposited over the sidewalls of holes 204. (An exemplary, not limiting process is chemical vapor deposition or sputtering of silicon dioxide, followed by removal of dielectric 514 from the hole bottoms, e.g. by a masked etch or an unmasked vertical etch, to expose the features 510; the dielectric does not have to be removed if the feature will not be exposed—note feature 510.5). Then a conductor 204M, e.g. metal, is formed to physically contact or be capacitively coupled to the adjacent (e.g. underlying) features 510 and fill up the holes 204 (in some embodiments, conductor 204M is electroplated copper, but other metal or non-metal conductors and processes can be used). In other embodiments, conductor 204M lines the hole surfaces but does not fill up the holes; the holes can be filled up by another filler. If the conductor was deposited outside of holes 204, and the conductor is not desired outside the holes, the conductor can be removed outside the holes, by CMP or an etch for example. In some embodiments, the conductor is patterned outside the holes to provide interconnects or other circuit elements.

Dielectric 514 is omitted from subsequent drawings for simplicity.

Figure 5E:
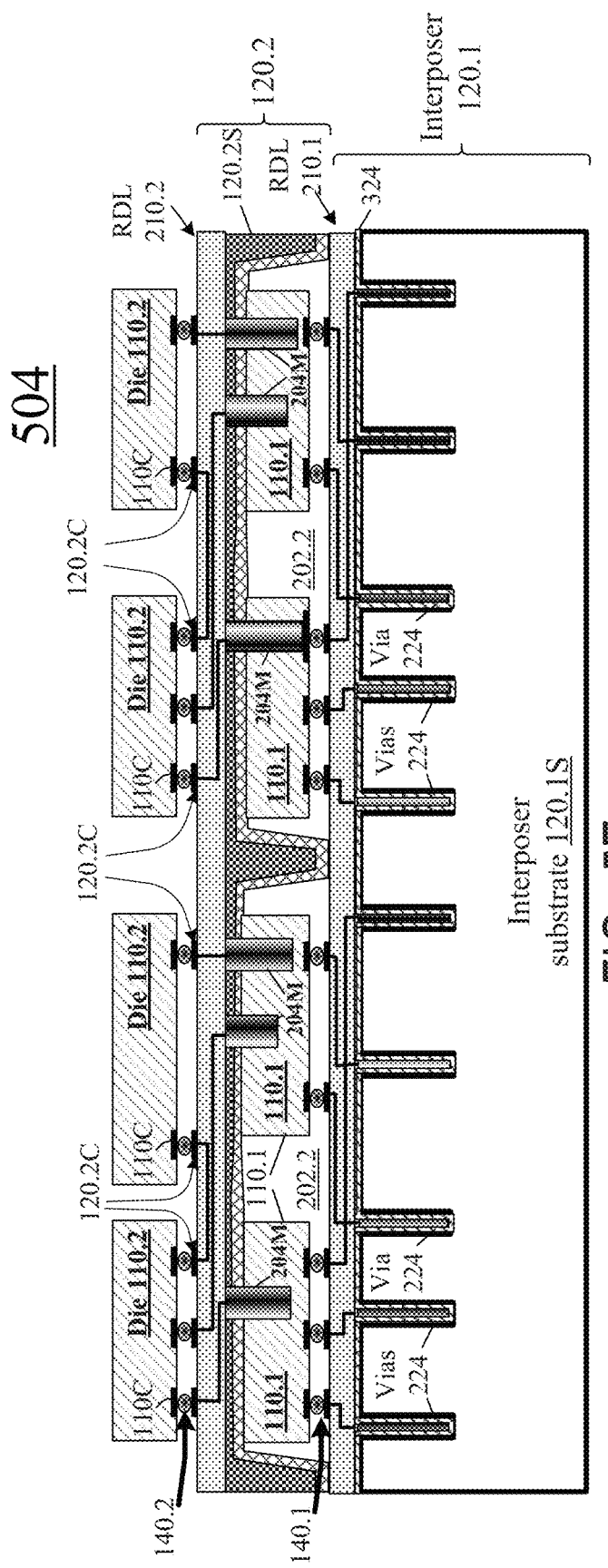

Then dies 110.2 (FIG. 5E) are attached to interposer 120.2, possibly in a manner similar to the attachment of dies 110.1 to interposer 120.1 (see FIG. 3E). Before the die attachment, any desired type of circuitry can be formed at the top of interposer 120.2. In the example of FIG. 5E, an optional RDL 120.2 is added to interposer 120.2 in a manner similar to RDL 120.1; the RDL 120.2 provides contact pads 120.2C on top of interposer 120.2, and provides conductive lines which interconnect the contact pads and the conductive vias 204M in a desired pattern. The RDL 120.2 is optional as the contact pads can be provided by conductive vias 204M.

The contact pads at the top of interposer 120.2 are connected to contact pads 110C of dies 110.2 by connections 140.2, which can be solder, adhesive, possibly using diffusion bonding or discrete wires or other techniques, as described above for connections 140, 140.1, 108, 154. Dies 110.2 do not have to be vertically aligned with dies 110.1.

Dies 110.2 can optionally be underfilled and/or encapsulated from above.

Figure 5F:
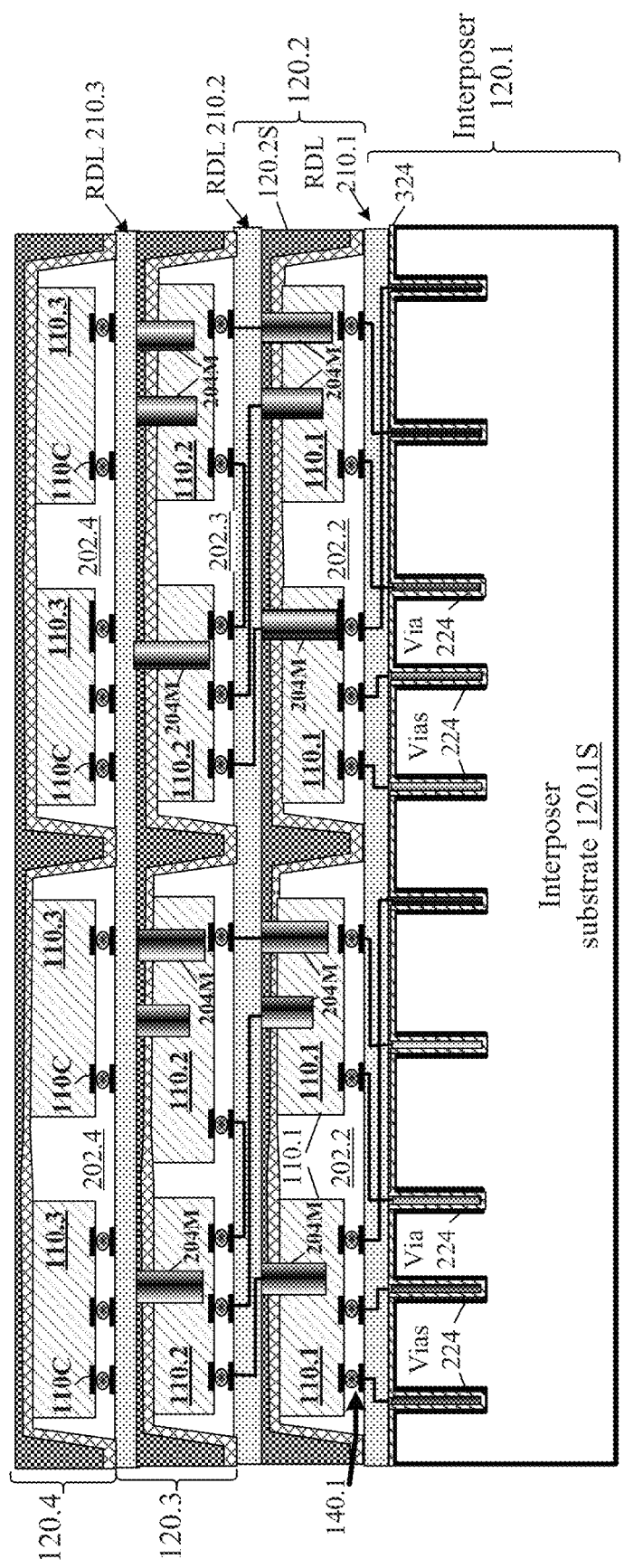

As illustrated in FIG. 5F, the process of FIGS. 4A-5E can be repeated any number of times to attach any number of die-on-interposer structures to interposer 120.2. In the example of FIG. 5F, interposer 120.3 is bonded to interposer 120.2 and can accommodate the dies 110.2 in its cavities 202.3. Alternatively, cavities can be provided in the top surface of interposer 120.2 to accommodate the dies 110.3 in whole or in part, or both interposers 120.2 and 120.3 may have cavities enclosing the dies as in FIG. 2.

Then conductive vias 204M are formed in interposer 120.3 to reach and possibly partially penetrate the dies 110.2, and other dies 110.3 are attached to interposer 120.3 so as to be electrically coupled to vias 204M (possibly through RDL 210.3 optionally formed on top of interposer 120.3, and/or through other circuits; FIG. 5F does not show the interconnects in RDL 210.3 for simplicity). The attachment and interconnection can be as for dies 110.1 (FIG. 3E). Another interposer 120.4 is attached on top to accommodate the dies in its cavities 202.4, and so on. The process can stop after the attachment of the last interposer 120.*i* (i=4 in FIG. 5F), or the last interposer can be omitted, i.e. the process can stop without an interposer over the top dies 110 (the dies may or may not be underfilled and/or encapsulated from above by epoxy or some other molding or non-molding compound).

In some embodiments, different interposers have different thickness, e.g. the top interposer may be thicker than the underlying interposers. The thickness of each interposer is defined as a function of desired properties, such as rigidity, resistance to warpage, heat dissipation, and assembly size.

Figure 5G:
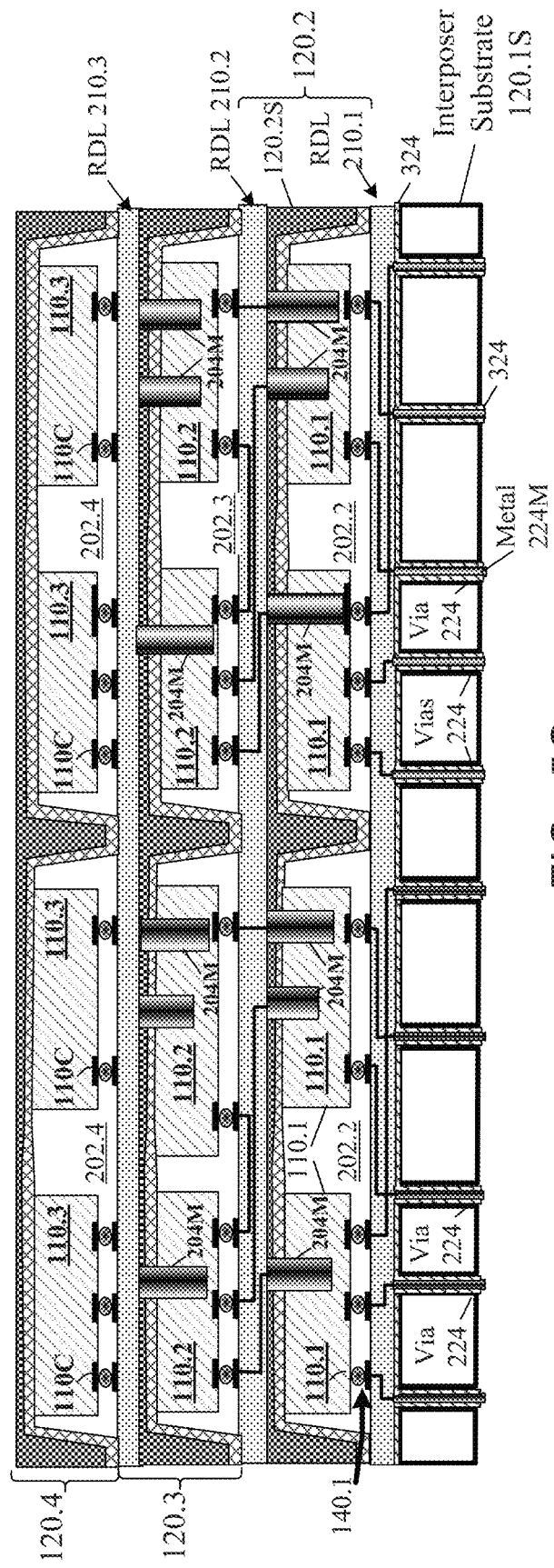

At any stage, possibly after the stage of FIG. 5F, the interposer 120.1 can be thinned from the bottom to expose the metal 224M (FIG. 5G). The thinning involves partial removal of substrate 120.1S and dielectric 324 (if the dielectric is present). The thinning may be performed by known techniques (e.g. mechanical grinding or lapping of substrate 120.1S followed by dry or wet, masked or unmasked etch of substrate 120.1S and dielectric 324; the substrate and the dielectric are etched simultaneously in some embodiments.) In some embodiments, dielectric 324 protrudes out of substrate 120.1S around metal 224M at the end of the thinning operation, and metal 224M protrudes out of the dielectric. See for example the aforementioned U.S. Pat. No. 6,958,285. As noted above, the invention is not limited to particular processes.

In some embodiments, even though the interposer 120.1 is reduced in thickness, the interposer 120.1 is kept flat by overlying interposer 120.2 and by higher interposers if present, so the handling of the assembly 504 is facilitated.

The overlying interposer(s) 120 also improve mechanical integrity (e.g. increase rigidity and weight) to further facilitate handling of the assembly. Also, the overlying interposers 120 help absorb and dissipate the heat generated during this and subsequent fabrication stages and in subsequent operation of assembly 504. The final thickness of substrate 120.1S can therefore be very low, e.g. 50 microns or even 5 microns or less. The same is true for the overlying interposers, or at least for the interposer portions at the cavities (above the dies). Hence, vias 204M and blind vias 224B (FIG. 3B) can be shallow. The shallow depth facilitates fabrication of the metallized vias (i.e. facilitates the via etch and subsequent deposition of dielectric and metal into the vias). The shallow depth also shortens the signal paths through the vias. Moreover, if the vias are short, each via can be narrower while still allowing reliable dielectric and metal deposition. The via pitch can therefore be reduced.

Subsequent process steps depend on the particular application. In some embodiments (FIG. 5H), RDL 210.B and/or other circuits are formed on the bottom of substrate 120.1S, possibly using the same techniques as for the RDLs and circuits on top of interposers. RDL 210.B provides contact pads 120.CB and connects them to metal 224M. (If the RDL is omitted, the contact pads are provided by metal 224M and/or other circuit elements). If desired, the assembly 504 can be diced into stacks (dies) 504S along dicing lines such as 520. Then the dies 504S, or the entire assembly 504 if dicing is omitted, can be attached and connected to other structures and or external devices, such as substrate 160 (e.g. a printed wiring substrate) and devices 104 in FIG. 2. The attachment uses connections 140.2 that can be solder or other types described above for connections 140 and 154. These details are not limiting.

Many variations are possible. The dies 110 on top of any interposer do not have to be aligned with the dies on any interposer above or below; therefore, the cavities enclosing a die on any interposer do not have to be aligned with any other cavities.

Figure 6:
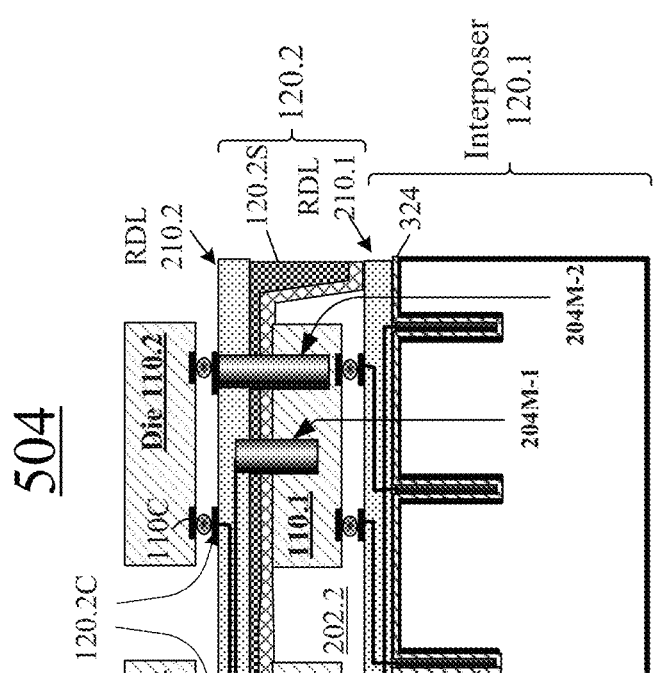

FIG. 6 shows a part of a similar cross section as in FIG. 5E, with conductive vias 204M-1 and 204M-2 passing through all or part of RDL 210.2. Any conductive via 204M may pass through all or part of a corresponding RDL, and may be formed after formation of all or part of the RDL.

Figure 7:
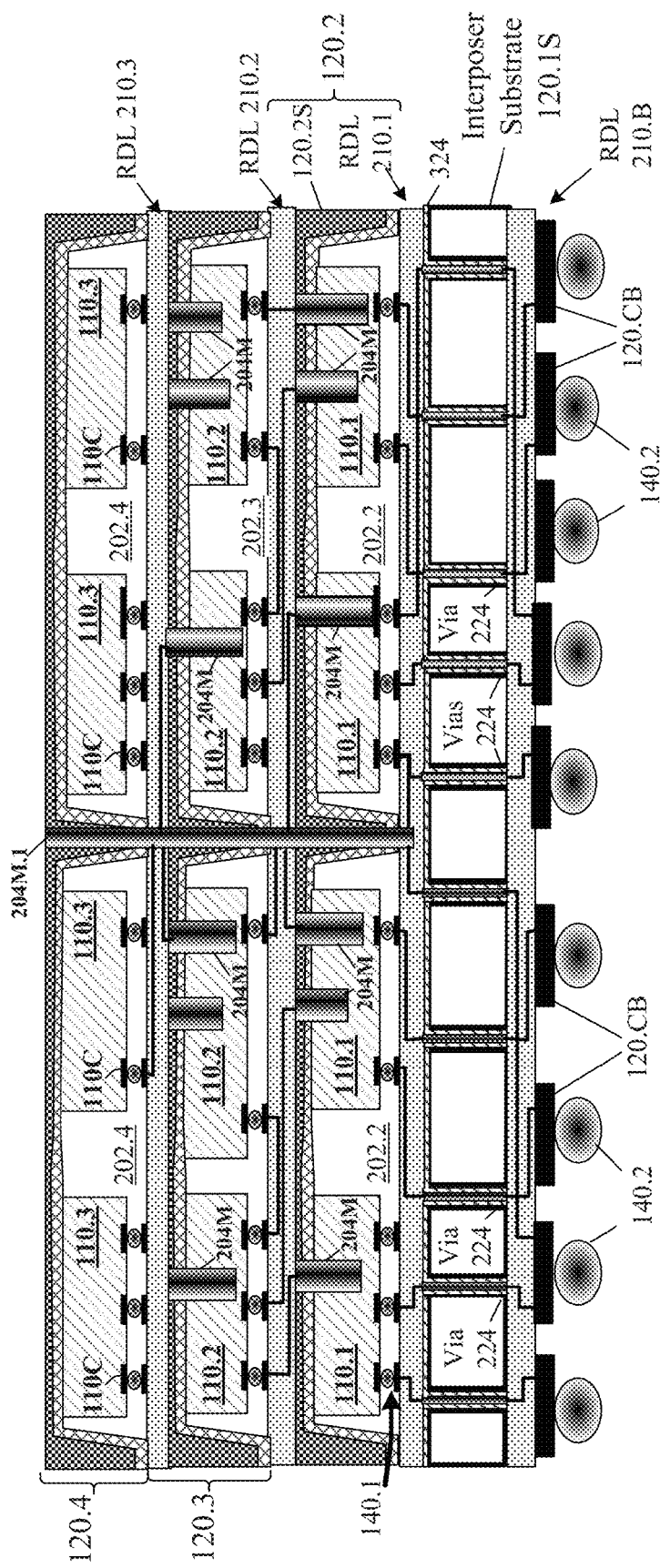

FIG. 7 illustrates a variation at the stage of FIG. 5G; as illustrated, a conductive via 204M (such as 204M.1 in FIG. 7) passes through multiple interposers (all the interposers 120.1 through 120.3 and partially through interposer 120.1 in FIG. 7). The via may physically contact, and electrically interconnect, any number of conductive of other features in the interposers. In FIG. 7, the via 204M.1 reaches each RDL 210 and is connected by the RDL's interconnects both to some of the RDL's contact pads attached to the overlying dies 110 and to some vias 204M or 224M that reach the RDL. Of note, the same die 110 can be connected to via 204M.1 from above—through via 204M entering the die, and from below—through the die's contact pads 110C. If a die is replaced by a multi-die module, the module can be connected from above and below; for example, the module's top die can be connected to via 204M from above, and the bottom die from below. This architecture is highly suitable for some types of circuits. One type is a memory cube: some of dies 110 can be memory or dies, and vias like 204M.1 can serve as TSVs (through-substrate vias) to connect the memory and logic to each other. The memory access terminals can be in interposer 120.1 or in circuits attached below the interposer, or the memory access terminals can be provided by a circuit (not shown) in the top interposer (such as 120.4), possibly on top of the top interposer, or by circuits formed above the top interposer. Some memory cubes are described for example in "Hybrid Memory Cube Specification 1.0", Hybrid Memory Cube Consortium, 2013, and U.S. Pat. No. 8,397,013 (Mar. 12, 2013, Rosenband et al.), both incorporated herein by reference.

It is assumed that dicing lines will not pass through vias 204M.1. Alternatively, the dicing dies may or may not pass through the vias; for example, a via 204M.1 can be used to test the structure before dicing, and/or to provide an interconnect which after dicing is located on a side of a die 504S.

Figure 8:
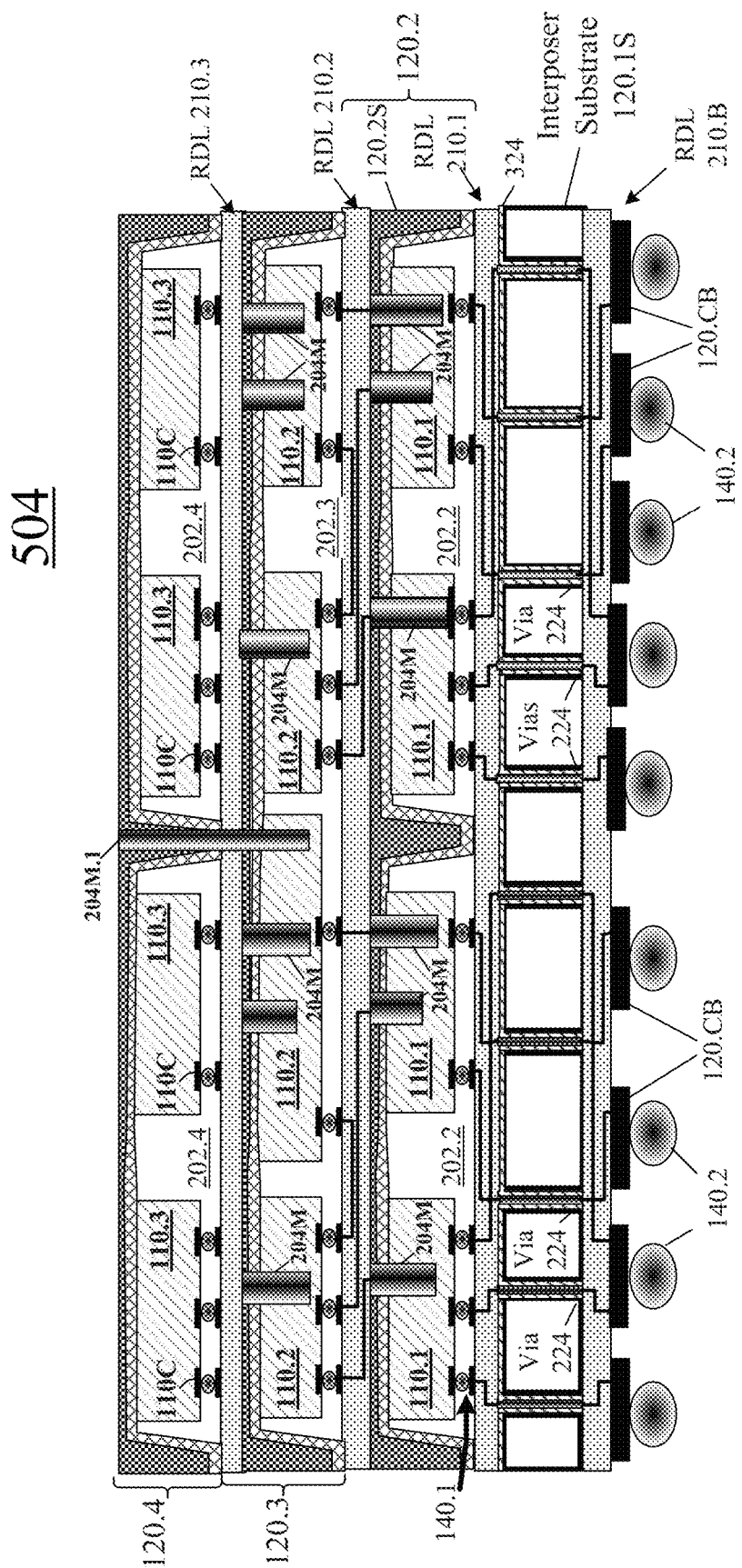

In FIG. 8 shows another variation at the same stage as FIG. 7: a via 204M.1 passes through interposer 120.4 between the cavities 202.4 and enters a cavity 202.3 and die 110.3 in the cavity to interconnect a feature or features (not shown) in the die to another feature or features (not shown) in RDL 210.3 or interposer 120.4.

Figure 9:
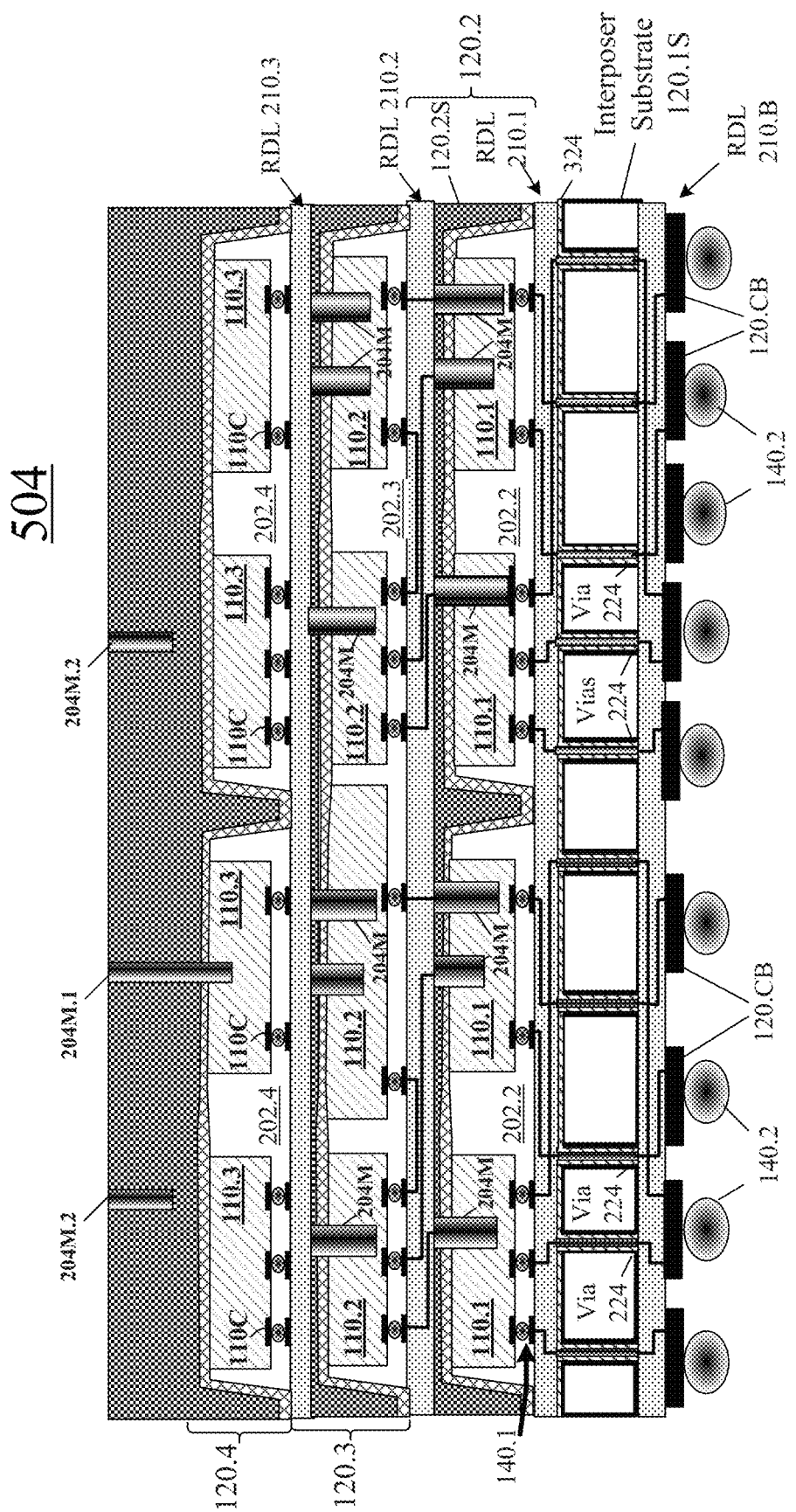

Some vias 204M may serve just as heat sinks, possibly having no electrical functionality. FIG. 9 shows an example (at the same stage as FIG. 8) with such vias 204M.1, 204M.2. Via 204M.1 passes through interposer 120.4 and partially through a die 110.3 in cavity 202.4. Vias 204M.2 pass partway through interposer 120.4 and do not reach the interposer's cavities. Such vias can be present at any level, i.e. in any interposer; for example, they can be placed next to, and/or inside, a die which is expected to generate much heat (e.g. a microprocessor die).

Figure 10:
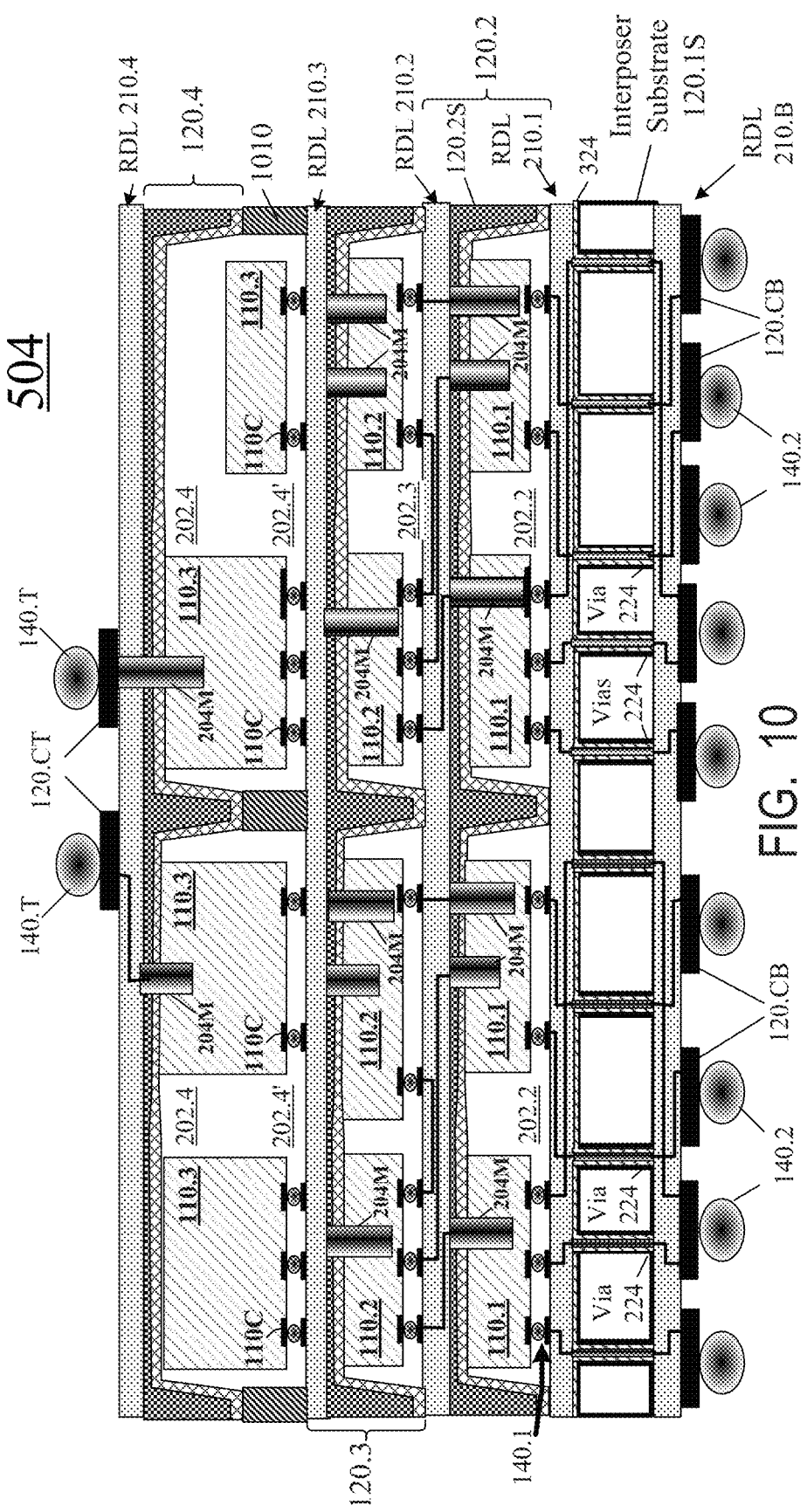

FIG. 10 shows another variation: RDL 210.4 is added on top of the upper interposer 120.4. The RDL provides top contact pads 120.CT that can be connected to other IC assemblies or discrete devices, using for example connections 140.T that can be of any type described above for connections 140 and 154. Vias 204M pass through the interposer 120.4 and partially through dies in interposer cavities 202.4 as in other embodiments described above.

Further, the assembly includes a reinforcement frame (stiffener frame) 1010. Reinforcement frame 1010 is similar to an interposer but has through holes 202.4' in place of cavities; dies 110.3 are located in through holes 202.4' and may extend up into respective cavities 202.4. Due to the reinforcement frame, the cavities 202.4 can be shallower. Of note, the reinforcement frame 1010 does not need a layer like dielectric 434.

Figure 11:
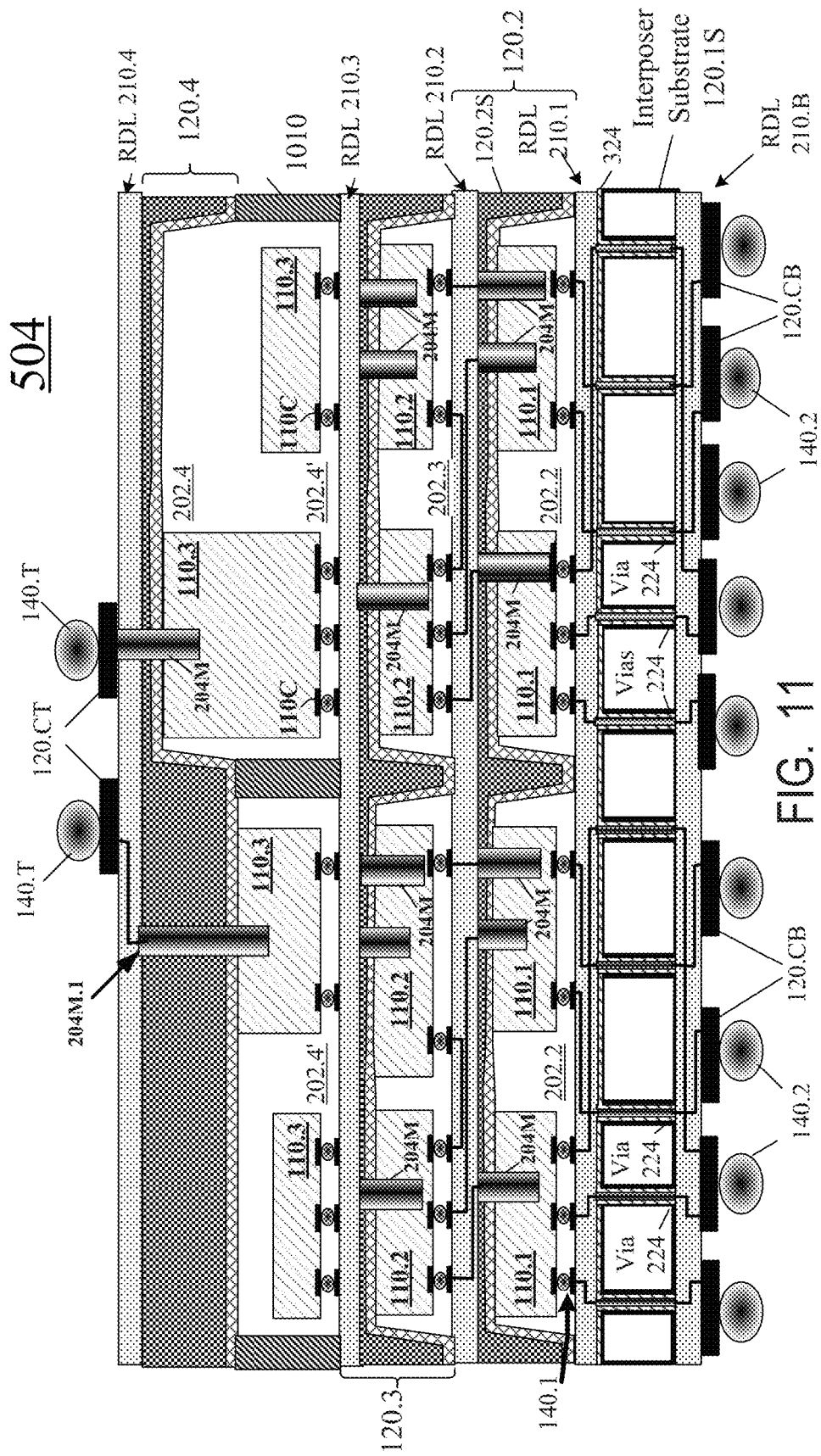

Through holes 202.4' may or may not be vertically aligned with cavities 202.4; see for example FIG. 11 which is similar to FIG. 10 but interposer 120.4 does not have a cavity over one of through-holes 202.4'; this through hole has multiple dies one of which is penetrated by a via 204M.1 passing through the substrate of interposer 120.4.

Features described above can be used separately or in any combination. For example, the top RDL 210.4 with the top contact pads 120.CT can be provided in any of the embodiments of FIGS. 5H through 9. Also, reinforcement frame 1010 can be omitted in the embodiment of FIG. 10 or 11, and/or can be provided at any level: any number of reinforcement frames can be stacked between any two adjacent interposers and/or above the top interposer in any of the embodiments of FIGS. 5H through 11. Also, the conductive vias 204M of any figure can be present the other embodiments of other figures at any level. Other features can be similarly combined or omitted.

As illustrated in FIG. 2, an interposer such as 120.2 may include a die (such as 110.2) attached to the interposer's bottom surface: the die has contact pads on top (similar to 110C in FIG. 10) that are connected to contact pads (not shown) on the bottom of interposer 120.2 in cavity 202.2. A metallized via 204 can be made in the interposer's (or interposer's substrate's) top surface before or after the interposer attachment to interposer 120.1 (we use the numeral 204 for either a hole or a conductive via 204M in the hole. Advantageously, the conductive via 204 (or even the hole) can be formed after the interposer-to-interposer attachment, when the assembly is mechanically stronger and more capable to dissipate heat. The via can pass through part of die 110.2 and connect circuitry on top of interposer 120.2 to a circuit feature in die 110.2. Another metallized via 204 can be made in the bottom surface of interposer 120.1 or the interposer's substrate (not shown separately) using similar techniques and may reach or even enter die 110.2 to be electrically coupled to the die's circuitry (not shown).

Further, the die 110.2 can be replaced by an assembly, and the same is true for all dies 110 described above. See FIG. 12 which is similar to FIG. 2 but die 110.2 is replaced by a stack of three dies 110.2', 110.2", 110.3''' of different dimensions. Die 110.2' has its top contact pads attached to contact pads of interposer 120.2 in cavity 202.2; die 110.2" has its top contact pads attached to bottom contact pads of die 110.2'; die 110.2''' has its top contact pads attached to bottom contact pads of die 110.2". In addition, die 110.2" has a bottom contact pad attached to a top contact pad of interposer 120.1 by a connection 140.1. Die 110.2" also has a top contact pad attached to a bottom contact pad of interposer 120.2 outside of cavity 202.2 by a stud 154.1. Stud 154.1 can be, for example, as described above, or as described in U.S. pre-grant patent publication 2014/0036454 (Feb. 6, 2014, Caskey et al., entitled "BVA Interposer", incorporated herein by reference), or can be some other kind of connection.

Die 110.2''' is located in cavity 202.1 of interposer 120.1, and may have bottom contact pads connected to those of interposer 120.1 (this is not shown).

Vias 204 is as in FIG. 2, and can be structurally and/or functionally similar similarly to any via 204M described above. Bottom via 204 enters multiple dies 110.2", 110.2'''; the same is true for other architectures described above: a via 204 may pass through and enter any number of dies and be electrically coupled to circuitry in multiple dies in all or some of the dies that the via enters.

Figure 12:
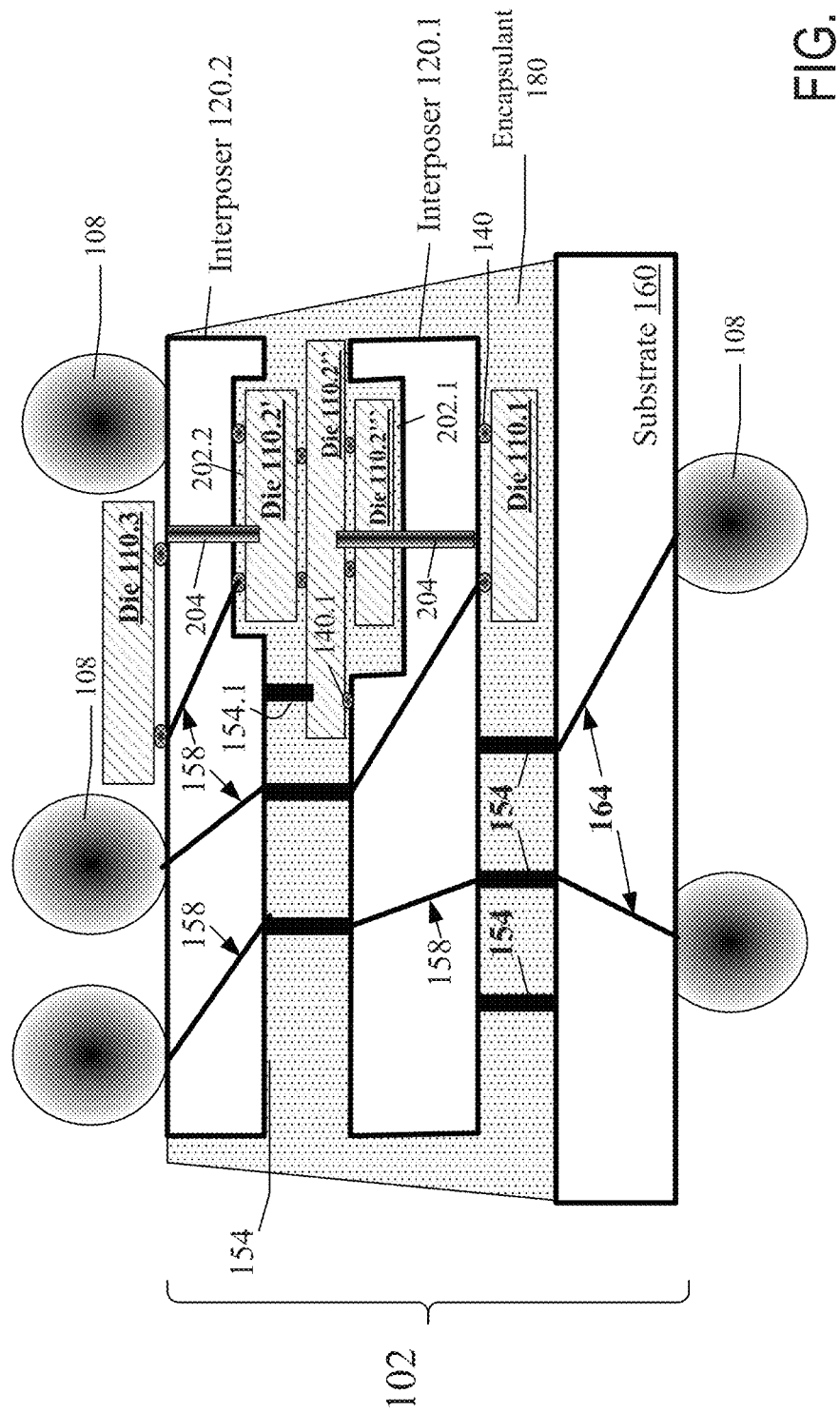
Figure 13:
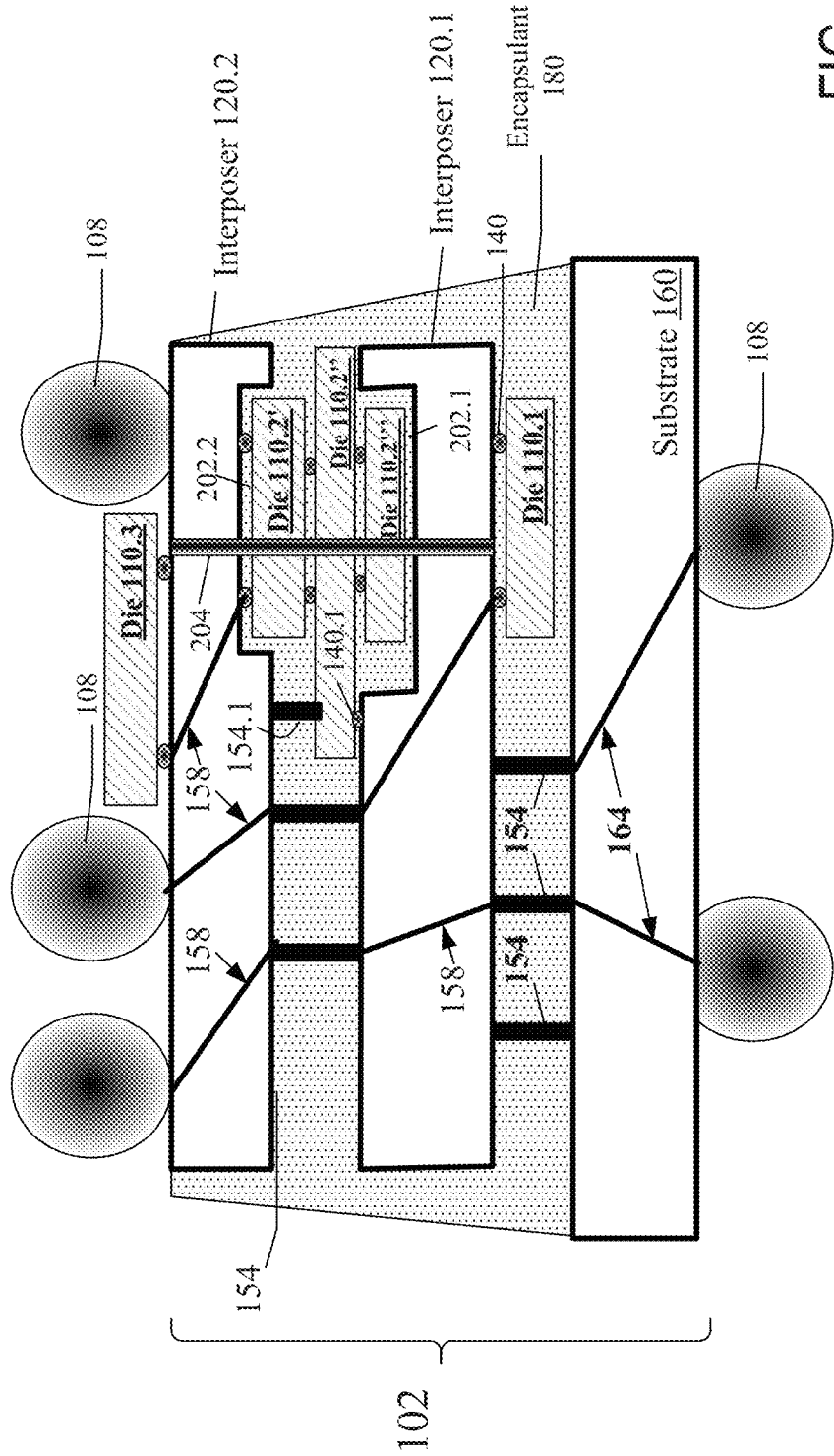

FIG. 13 is like FIG. 12 but shows a via 204 passing through all the three dies 110.2', 110.2", 110.2''' and both interposers 120.1, 120.2. The via passes through the cavities 202.1 and 202.2.

Some embodiments include methods and structures defined by the following clauses:

Clause 1 defines method for fabricating a microelectronic assembly, the method comprising:

obtaining a first structure (e.g. as in FIG. 2 or 5B or 12 or other figures) comprising:

a plurality of interposers (e.g. 120.1, 120.2) overlying one another and comprising a first interposer (e.g. 120.1 in FIG. 5B or 120.2 in FIG. 2) and a second interposer (e.g. 120.2 in FIG. 5B or 120.1 in FIG. 2), each of the first and second interposers comprising a first side facing the other one of the first and second interposers and comprising a second side opposite to the first side, wherein at least the first interposer comprises one or more first contact pads at its first side (e.g. on top of RDL 210.1 in FIG. 5B or on the bottom of interposer 120.2 in FIG. 2);

one or more first modules (e.g. dies or other assemblies 110.1 in FIG. 5B or 110.2 in FIG. 2 or 110.2'+110.2"+110.2"' in FIG. 12) attached to the first interposer between the first and second interposers, at least one first module comprising a semiconductor integrated circuit and comprising one or more contact pads electrically coupled to the integrated circuit and to at least one first contact pad (a die may contain circuitry electrically coupled to the die's contact pads); and wherein at least one of the first and second interposers comprises one or more first cavities (e.g. 202.2), and at least part of each first module is located in a respective first cavity; and after obtaining the first structure, forming one or more first conductive vias (e.g. 204M) each of which passes through at least part of at least one of the first and second interposers to reach at least one respective first cavity and to physically contact, or be capacitively coupled to, circuitry of at least one respective first module at least partially located in the respective first cavity (such as any via 204M in FIG. 5D for example).

Clause 2 defines the method of clause 1 wherein at least one first conductive via enters at least one respective first module (alternatively, the via may terminate at the surface of a first module without entering the first module).

Clause 3 defines the method of any preceding clause wherein at least one first conductive via enters a semiconductor substrate of at least one semiconductor integrated circuit of at least one first module.

Clause 4 defines the method of any preceding clause wherein at least one first conductive via passes through a semiconductor substrate of at least one semiconductor integrated circuit of at least one first module.

Clause 5 defines the method of any preceding clause wherein at least one first conductive via passes through at least part of each of the first and second interposers and through the respective first cavity.

Clause 6 defines the method of any preceding clause wherein at least one first conductive via passes through at least part of the second interposer (e.g. through substrate 120.2S of interposer 120.2 in FIG. 5D) and enters at least one respective first module.

Of note, in a variation of FIG. 2, an additional via 204M (not shown) can pass through the substrate of interposer 120.1 into cavity 202.1 and can enter the die 110.2.

Clause 7 defines the method of any preceding clause further comprising, after forming the one or more first conductive vias, attaching a second module (e.g. a die or module 1110.2 in FIG. 5E) to the second interposer's second side to electrically couple circuitry in the second module to at least one first conductive via which passes through at least part of the second interposer to enter a first module and electrically couple circuitry in the first module to circuitry in the second module.

Clause 8 defines the method of any preceding clause wherein each first conductive via is formed in a respective first hole (e.g. 204 in FIG. 5C.1) formed after obtaining the first structure.

Clause 9 defines the method of any preceding clause further comprising:

forming one or more second holes (e.g. for thermal vias 204M.1 or 204M.2 in FIG. 9) each of which passes at least partially through at least one of the first and second interposers;

forming thermally conductive material in each second hole, the thermally conductive material having a higher thermal conductivity than at least one of the first and second interposers' portions which contains at least part of the second hole, the thermally conductive material having no electrical functionality. (For example, the thermally conductive material can be metal.)

Clause 10 defines the method of any preceding clause further comprising forming one or more second conductive vias (such as 204M.1 in FIG. 7) each of which at least partially passes through a set of two or more of the interposers (all the interposers in FIG. 7).

Clause 11 defines the method of clause 10 wherein at least one second conductive via is electrically coupled to first conductive vias passing through at least parts of at least two of the interposers of the set.

Clause 12 defines the method of clause 10 or 11 wherein at least one second conductive via is formed after obtaining the first structure. (In some embodiments, the holes for the vias can be formed after obtaining the first structure such as shown in FIG. 5B, or can at least partially be formed at an earlier stage; for the example, the hole portions passing through substrate 120.2S can be formed before the interposer-to-interposer bonding.)

Clause 13 defines the method of any preceding clause wherein each interposer has a substrate, and each first conductive via passes through the respective interposer's substrate.

Clause 14 defines the method of clause 13 wherein each substrate is a semiconductor substrate.

Clause 15 defines a microelectronic assembly comprising:

a plurality of interposers overlying one another and comprising a set of at least two interposers each of which comprises one or more first contact pads;

a plurality of first modules each of which is attached to at least one of the interposers and comprises a respective semiconductor integrated circuit and one or more contact pads each of which is electrically coupled to the integrated circuit and connected to a respective first contact pad, wherein each interposer in the set has a first contact pad connected to a contact pad of a first module;

wherein at least one of the interposers comprises one or more first cavities, and at least part of each first module is located in at least one respective first cavity;

wherein the microelectronic assembly further comprises:

one or more first conductive vias each of which passes through at least part of at least respective one of the interposers and reaches at least one respective first cavity and physically contacts, or is capacitively coupled to, circuitry of at least one respective first module at least partially located in the respective first cavity;

one or more second conductive vias (for example, 204M.1 in FIG. 7) each of which has a segment which at least partially passes through at least respective two of the interposers outside of any first cavity which have respective first conductive vias (e.g. other vias 204M in FIG. 7) electrically coupled to the segment.

Clause 16 defines the microelectronic assembly of claim 15 wherein for at least one second conductive via, the respective first conductive vias are electrically coupled to said segment of the second conductive via.

Clause 17 defines the microelectronic assembly or method of any preceding clause wherein each interposer has a substrate, and each first conductive via passes through the respective interposer's substrate.

Clause 18 defines the microelectronic assembly of clause 17 wherein each substrate is a semiconductor substrate.

Clause 19 defines the microelectronic assembly or method of any preceding clause wherein at least one first conductive via enters a semiconductor substrate of at least one semiconductor integrated circuit of at least one first module.

Clause 20 defines the microelectronic assembly or method of any preceding clause wherein at least one first conductive via passes through a semiconductor substrate of at least one semiconductor integrated circuit of at least one first module.

Clause 21 defines the method or microelectronic assembly of any preceding clause wherein each conductive via extends along a vertical axis which is an imaginary line passing through the via.

Clause 22 defines the method or microelectronic assembly of any preceding clause wherein at least one first conductive via enters at least one respective first module.

The invention is not limited to the embodiments described above. Other embodiments and variations are within the scope of the invention, as defined by the appended claims.

The invention claimed is:

1. A microelectronic assembly comprising:
   a plurality of interposers overlying one another and comprising a set of at least two interposers each of which comprises one or more first contact pads;
   a plurality of first modules each of which is attached to at least one of the interposers and comprises a respective semiconductor integrated circuit and one or more contact pads each of which is electrically coupled to the integrated circuit and connected to a respective first contact pad, wherein each interposer in the set has a first contact pad connected to a contact pad of a first module;
   wherein at least one of the interposers comprises one or more first cavities, and at least part of each first module is located in at least one respective first cavity;
   wherein the microelectronic assembly further comprises:
   one or more first conductive vias each of which passes through at least part of at least respective one of the interposers and reaches at least one respective first cavity and physically contacts, or is capacitively coupled to, circuitry of at least one respective first module at least partially located in the respective first cavity;
   one or more second conductive vias each of which has a segment which at least partially passes through at least respective two of the interposers outside of any first cavity which have respective first conductive vias.

2. The microelectronic assembly of claim 1 wherein for at least one second conductive via, the respective first conductive vias are electrically coupled to said segment of the second conductive via.

3. The microelectronic assembly of claim 1 wherein each interposer has a substrate, and each first conductive via passes through the respective interposer's substrate.

4. The microelectronic assembly of claim 3 wherein each substrate is a semiconductor substrate.

5. The microelectronic assembly of claim 1 wherein at least one first conductive via enters a semiconductor substrate of at least one semiconductor integrated circuit of at least one first module.

6. The microelectronic assembly of claim 1 wherein at least one first conductive via passes through a semiconductor substrate of at least one semiconductor integrated circuit of at least one first module.

7. The microelectronic assembly of claim 1 wherein each via of the first and second conductive vias extends along a vertical axis which is an imaginary line passing through the via.

8. The microelectronic assembly of claim 1 wherein at least one first conductive via enters at least one respective first module.

9. A microelectronic assembly comprising:
   a plurality of interposers overlying one another, each interposer comprising one or more first contact pads;
   a plurality of first modules each of which is attached to at least one of the interposers and comprises a respective semiconductor integrated circuit and one or more contact pads each of which is electrically coupled to the integrated circuit and connected to a respective first contact pad, wherein at least one said interposer has a first contact pad connected to a contact pad of a first module;
   wherein at least one of the interposers comprises one or more first cavities, each first cavity being located between two of the interposers, and at least part of each first module is located in at least one respective first cavity;
   wherein the microelectronic assembly further comprises one or more first conductive vias, each first conductive via extending along a vertical axis which is an imaginary line passing through the via, each first conductive via passing through at least part of at least one respective interposer and reaching a respective first cavity and physically contacting, or being capacitively coupled to, circuitry of at least one respective first module at least partially located in the respective first cavity.

10. The microelectronic assembly of claim 9 wherein at least one first conductive via passes through a substrate of at least one respective interposer bounding the respective first cavity.

11. The microelectronic assembly of claim 10 wherein the substrate of the at least one respective interposer is a semiconductor substrate.

12. The microelectronic assembly of claim 10 wherein at least one first conductive via enters a semiconductor substrate of at least one semiconductor integrated circuit of at least one respective first module on a first side of the respective first module, and the respective first module has one or more contact pads on a second side opposite from the first side.

13. The microelectronic assembly of claim 12 wherein said at least one first conductive via has a first end in the semiconductor substrate of said at least one semiconductor integrated circuit of the first module and has another end at a contact pad of the microelectronic assembly.

* * * * *